(12) United States Patent
Morgan et al.

(10) Patent No.: US 9,337,373 B2
(45) Date of Patent: May 10, 2016

(54) LIGHT-GUIDE SOLAR MODULE, METHOD OF FABRICATION THEREOF, AND PANEL MADE THEREFROM

(75) Inventors: John Paul Morgan, Toronto (CA); Philip M. Chang, Toronto (CA); Stefan Myrskog, Maple (CA); Nigel Morris, Toronto (CA)

(73) Assignee: MORGAN SOLAR INC., Toronto (CA)

( * ) Notice: Subject to any disclaimer, the term of this patent is extended or adjusted under 35 U.S.C. 154(b) by 940 days.

(21) Appl. No.: 13/195,537

(22) Filed: Aug. 1, 2011

(65) Prior Publication Data

US 2012/0055552 A1 Mar. 8, 2012

Related U.S. Application Data

(63) Continuation-in-part of application No. 12/705,415, filed on Feb. 12, 2010, now Pat. No. 9,040,808, which
(Continued)

(30) Foreign Application Priority Data

Jul. 30, 2010 (WO) ................ PCT/CA2010/001181

(51) Int. Cl.
*H01L 31/00* (2006.01)
*H01L 31/18* (2006.01)
(Continued)

(52) U.S. Cl.
CPC ............ *H01L 31/18* (2013.01); *H01L 31/0547* (2014.12); *H02S 20/00* (2013.01); *Y02E 10/52* (2013.01)

(58) Field of Classification Search
CPC . H01L 31/18; H01L 31/0522; H01L 31/0422; H01L 31/0547; Y02E 10/52; H02S 20/00
USPC ......................................................... 136/259
See application file for complete search history.

(56) References Cited

U.S. PATENT DOCUMENTS 3,780,722 A 12/1973 Swet
4,037,096 A 7/1977 Brendgord et al.
(Continued)

FOREIGN PATENT DOCUMENTS

DE 19937448 A1 2/2001
EP 1895228 A1 3/2008
(Continued)

OTHER PUBLICATIONS

English Abstract of FR2872256, (publication date Dec. 30, 2005).
(Continued)

*Primary Examiner* — Tamir Ayad
(74) *Attorney, Agent, or Firm* — BCF LLP

(57) ABSTRACT

A photovoltaic light guide solar concentration apparatus has a deflecting layer, a light-guide layer optically coupled to the deflecting layer, a secondary optic and a photovoltaic cell. The photovoltaic concentration apparatus has a central optical axis that, in operation, is parallel to incident sunlight. A deflecting layer includes a plurality of focusing elements symmetrically arranged with respect to the central optical axis. The light-guide layer is optically coupled to the plurality of focusing elements of the deflecting layer. The light-guide layer has a reflective surface and a plurality of opposite facets symmetrically arranged with respect to the central axis and focused sunlight from the deflection layer enters the light-guide layer and is directed and trapped by the reflective surface and the opposite facets and guided inside the light-guide layer towards an exit aperture through total internal reflections. A secondary optic is coaxially located with respect to the central optical axis and is coupled to the light guide layer the secondary optic that has at least one reflective surface. The secondary optic redirects the light towards the exit aperture. A photovoltaic cell is located at the exit aperture and on the central axis to receive sunlight from the secondary optic within an acceptance angle relative to the central axis.

19 Claims, 44 Drawing Sheets

Related U.S. Application Data is a continuation-in-part of application No. 12/113,705, filed on May 1, 2008, now Pat. No. 7,873,257.

(60) Provisional application No. 60/951,775, filed on Jul. 25, 2007, provisional application No. 60/942,745, filed on Jun. 8, 2007, provisional application No. 60/915,207, filed on May 1, 2007, provisional application No. 61/151,006, filed on Feb. 9, 2009, provisional application No. 61/229,542, filed on Jul. 29, 2009.

(51) Int. Cl.
*H01L 31/054* (2014.01)
*H01L 31/042* (2014.01)

(56) References Cited

U.S. PATENT DOCUMENTS

| | | |
|---|---|---|
| 4,074,704 A | 2/1978 | Gellert |
| 4,151,582 A | 4/1979 | Grunberger |
| 4,199,376 A | 4/1980 | Sill |
| 4,252,416 A | 2/1981 | Jaccard |
| 4,257,401 A | 3/1981 | Daniels |
| 4,261,335 A | 4/1981 | Balhorn |
| 4,282,862 A | 8/1981 | Soleau |
| 4,292,959 A | 10/1981 | Coburn |
| 4,344,417 A | 8/1982 | Malecek |
| 4,357,486 A | 11/1982 | Blieden et al. |
| 4,379,613 A | 4/1983 | Coburn |
| 4,389,698 A | 6/1983 | Cibie |
| 4,411,490 A | 10/1983 | Daniel |
| 4,432,039 A | 2/1984 | Cibie |
| 4,496,211 A | 1/1985 | Daniel |
| 4,505,264 A | 3/1985 | Tremblay |
| 4,529,830 A | 7/1985 | Daniel |
| 4,539,625 A | 9/1985 | Bornstein et al. |
| 4,691,994 A | 9/1987 | Afian et al. |
| 4,697,867 A | 10/1987 | Blanc et al. |
| 4,798,448 A | 1/1989 | Van Raalte |
| 4,863,224 A | 9/1989 | Afian et al. |
| 4,954,930 A | 9/1990 | Maegawa et al. |
| 5,050,946 A | 9/1991 | Hathaway |
| 5,089,055 A | 2/1992 | Nakamura |
| 5,136,480 A | 8/1992 | Pristash et al. |
| 5,197,792 A | 3/1993 | Jiao et al. |
| 5,202,950 A | 4/1993 | Arego et al. |
| 5,220,462 A | 6/1993 | Feldman, Jr. |
| 5,255,666 A * | 10/1993 | Curchod ............... 126/569 |
| 5,280,557 A | 1/1994 | Nwasokwa |
| 5,357,592 A | 10/1994 | Neilson |
| 5,385,615 A | 1/1995 | Horne |
| 5,390,085 A | 2/1995 | Mari-Roca et al. |
| 5,396,350 A | 3/1995 | Beeson et al. |
| 5,438,485 A | 8/1995 | Li et al. |
| 5,485,291 A | 1/1996 | Qiao et al. |
| 5,485,354 A | 1/1996 | Ciupke et al. |
| 5,498,297 A | 3/1996 | O'Neill et al. |
| 5,521,725 A | 5/1996 | Beeson et al. |
| 5,528,720 A | 6/1996 | Winston et al. |
| 5,540,216 A | 7/1996 | Rasmusson |
| 5,664,862 A | 9/1997 | Redmond et al. |
| 5,719,649 A | 2/1998 | Shono et al. |
| 5,806,955 A | 9/1998 | Parkyn, Jr. et al. |
| 5,838,403 A | 11/1998 | Jannson et al. |
| 5,877,874 A | 3/1999 | Rosenberg |
| 5,914,760 A | 6/1999 | Daiku |
| 5,926,601 A | 7/1999 | Tai et al. |
| 5,977,478 A | 11/1999 | Hibino et al. |
| 6,021,007 A | 2/2000 | Murtha |
| 6,036,340 A | 3/2000 | Fohl et al. |
| 6,072,551 A | 6/2000 | Jannson et al. |
| 6,097,549 A | 8/2000 | Jenkins et al. |
| 6,108,059 A | 8/2000 | Yang |
| 6,129,439 A | 10/2000 | Hou et al. |
| 6,139,176 A | 10/2000 | Hulse et al. |
| 6,201,246 B1 | 3/2001 | Potekev et al. |
| 6,224,223 B1 | 5/2001 | Higuchi et al. |
| 6,252,155 B1 | 6/2001 | Ortabasi |
| 6,294,723 B2 | 9/2001 | Uematsu et al. |
| 6,367,941 B2 | 4/2002 | Lea et al. |
| 6,379,016 B1 | 4/2002 | Boyd et al. |
| 6,425,391 B1 | 7/2002 | Davoren et al. |
| 6,440,769 B2 | 8/2002 | Peumans et al. |
| 6,461,007 B1 | 10/2002 | Akaoka |
| 6,473,554 B1 | 10/2002 | Pelka et al. |
| 6,476,312 B1 | 11/2002 | Barnham |
| 6,541,694 B2 | 4/2003 | Winston et al. |
| 6,570,710 B1 | 5/2003 | Nilsen et al. |
| 6,576,887 B2 | 6/2003 | Watson et al. |
| 6,607,286 B2 | 8/2003 | West et al. |
| 6,612,709 B2 | 9/2003 | Yamada et al. |
| 6,623,132 B2 | 9/2003 | Lekson et al. |
| 6,639,733 B2 | 10/2003 | Minano et al. |
| 6,647,199 B1 | 11/2003 | Pelka et al. |
| 6,730,840 B2 | 5/2004 | Sasaoka et al. |
| 6,811,277 B2 | 11/2004 | Amano |
| 6,819,687 B1 | 11/2004 | Fein |
| 6,899,443 B2 | 5/2005 | Rizkin et al. |
| 6,966,661 B2 | 11/2005 | Read |
| 7,021,805 B2 | 4/2006 | Amano et al. |
| 7,046,907 B2 | 5/2006 | Miyashita |
| 7,083,313 B2 | 8/2006 | Smith |
| 7,134,778 B2 | 11/2006 | Kazuhiro et al. |
| 7,160,010 B1 | 1/2007 | Chinniah et al. |
| 7,286,296 B2 | 10/2007 | Chaves et al. |
| 7,347,611 B2 | 3/2008 | Kwon |
| 7,371,001 B2 | 5/2008 | Miyashita |
| 7,664,350 B2 | 2/2010 | Ghosh et al. |
| 7,672,549 B2 | 3/2010 | Ghosh et al. |
| 7,807,920 B2 * | 10/2010 | Linke et al. ............ 136/246 |
| 2002/0148497 A1 | 10/2002 | Sasaoka et al. |
| 2003/0063474 A1 | 4/2003 | Coushaine |
| 2003/0067760 A1 | 4/2003 | Jagt et al. |
| 2003/0075167 A1 | 4/2003 | Minano Dominguez et al. |
| 2003/0075212 A1 | 4/2003 | Chen |
| 2004/0022071 A1 | 2/2004 | Cheng et al. |
| 2004/0103938 A1 | 6/2004 | Rider |
| 2005/0111235 A1 | 5/2005 | Suzuki et al. |
| 2005/0129358 A1 | 6/2005 | Minano et al. |
| 2005/0254259 A1 | 11/2005 | Yamashita et al. |
| 2006/0072222 A1 | 4/2006 | Lichy |
| 2006/0077692 A1 | 4/2006 | Noh et al. |
| 2006/0098929 A1 | 5/2006 | Steenblik et al. |
| 2006/0207650 A1 | 9/2006 | Winston et al. |
| 2007/0047260 A1 | 3/2007 | Lee et al. |
| 2007/0171418 A1 | 7/2007 | Nyhart, Jr. |
| 2007/0246040 A1 | 10/2007 | Schaafsma |
| 2007/0251568 A1 | 11/2007 | Maeda |
| 2008/0002159 A1 | 1/2008 | Liu et al. |
| 2008/0041441 A1 | 2/2008 | Schwartzman |
| 2008/0048102 A1 | 2/2008 | Kurtz et al. |
| 2008/0087323 A1 | 4/2008 | Araki et al. |
| 2008/0165437 A1 | 7/2008 | DiDomenico |
| 2008/0184989 A1 | 8/2008 | Mecham |
| 2008/0223443 A1 | 9/2008 | Benitez et al. |
| 2008/0257408 A1 | 10/2008 | Chen et al. |
| 2008/0264486 A1 | 10/2008 | Chen et al. |
| 2008/0271776 A1 | 11/2008 | Morgan |
| 2008/0314436 A1 | 12/2008 | O'Connell et al. |
| 2009/0027872 A1 | 1/2009 | Debije et al. |
| 2009/0064993 A1 | 3/2009 | Ghosh et al. |
| 2009/0126792 A1 | 5/2009 | Gruhlke et al. |
| 2010/0024868 A1 | 2/2010 | Baruchi et al. |
| 2010/0037954 A1 | 2/2010 | Thony |
| 2010/0065120 A1 | 3/2010 | McDonald |
| 2010/0108124 A1 | 5/2010 | Knox et al. |
| 2010/0116336 A1 | 5/2010 | Martinez Anton et al. |
| 2010/0126554 A1 | 5/2010 | Morgan et al. |
| 2010/0165495 A1 | 7/2010 | Murtha |
| 2010/0202142 A1 | 8/2010 | Morgan et al. |

(56) References Cited

U.S. PATENT DOCUMENTS

| | | |
|---|---|---|
| 2010/0252026 A1 | 10/2010 | Schilling et al. |
| 2011/0011449 A1 | 1/2011 | Morgan et al. |

FOREIGN PATENT DOCUMENTS

| | | |
|---|---|---|
| EP | 2061093 A1 | 5/2009 |
| EP | 2077586 A1 | 7/2009 |
| EP | 2194584 A1 | 6/2010 |
| ES | P200803237 | 11/2008 |
| FR | 2872256 A1 | 12/2005 |
| GB | 1570684 A | 7/1980 |
| JP | 2001289515 A | 10/2001 |
| JP | 2003258291 A | 9/2003 |
| JP | 2005019587 A | 1/2005 |
| JP | 2005123036 A | 5/2005 |
| WO | 9826212 A1 | 6/1998 |
| WO | 0244766 A2 | 6/2002 |
| WO | 2004114418 A1 | 12/2004 |
| WO | 2006010249 A1 | 2/2006 |
| WO | 2006064365 A2 | 6/2006 |
| WO | 2006088369 A2 | 8/2006 |
| WO | 2007045917 A2 | 4/2007 |
| WO | 2008001277 A2 | 1/2008 |
| WO | 2008058245 A2 | 5/2008 |
| WO | 2008092679 A1 | 8/2008 |
| WO | 2008103987 A2 | 8/2008 |
| WO | 2009001106 A2 | 12/2008 |
| WO | 2009030037 A1 | 3/2009 |
| WO | 2009041330 A1 | 4/2009 |
| WO | 2009058619 A2 | 5/2009 |
| WO | 2009063416 A2 | 5/2009 |
| WO | 2009064701 A1 | 5/2009 |
| WO | 2009086293 A2 | 7/2009 |
| WO | 2009129599 A1 | 10/2009 |
| WO | 2010033859 A2 | 3/2010 |
| WO | 2010040053 A1 | 4/2010 |

OTHER PUBLICATIONS

English Abstract of JP2001289515, (publication date Oct. 19, 2001).
English Abstract of JP2003258291, (publication date Sep. 12, 2003).
English Abstract of JP2005019587, (publication date Jan. 20, 2005).
English Abstract of JP2005123036, (publication date May 12, 2005).
English Abstract of EP1895228, (publication date Mar. 5, 2008).
English Abstract of DE19937448, (publication date Feb. 8, 2001).
Benitez et al., "High Performance Fresnel-based Photovoltaic Concentrator", Apr. 26, 2010, Optical Society of America, vol. 18, No. S1.
Winston et al., "Planar Concentrators Near the Etendue Limit", Oct. 1, 2005, Optical Society of America, vol. 30, No. 19.
Chaves et al.: "Ideal Concentrators with Gaps", Mar. 1, 2002, Applied Optics, vol. 41, No. 7, pp. 1267-1276.
Chaves et al.: "Ultra Flat Ideal Concentrators of High Concentration", 2000, Solar Energy, vol. 69, No. 4, pp. 269-281.
Ghosh et al.: "A New Approach to Concentrating and Aggregating Light Energy", Jun. 2007.
Document "Chapter 2: Holographic Methods".
The William L. Bonnell Company, "Extrusion Process Description".
"Plastic and Their Properties".
"High Reflectors".
"Plexiglas Acrylic Molding Resin", 2008, Altuglas International.
Plexiglas Acrylic Molding Resin "Extrusion", 2008, Altuglas International.
JDSU "Thin Film Custom Optics", Dec. 2007.
"Meisner Acrylic Casting".
International Search Report of PCT/CA2010/001184; Nov. 22, 2010; Varma Suchita.
PCT Patent Application No. PCT/CA2008/000831, International Search Report dated Aug. 4, 2008; Ziaic Kazem.
Supplementary European Search Report of EP2153475; Oscar Chao; Jun. 22, 2010; Berlin.
PCT Patent Application No. PCT/IB2011/002613, International Search Report dated Mar. 29, 2012, Nicolas Louchet.

* cited by examiner

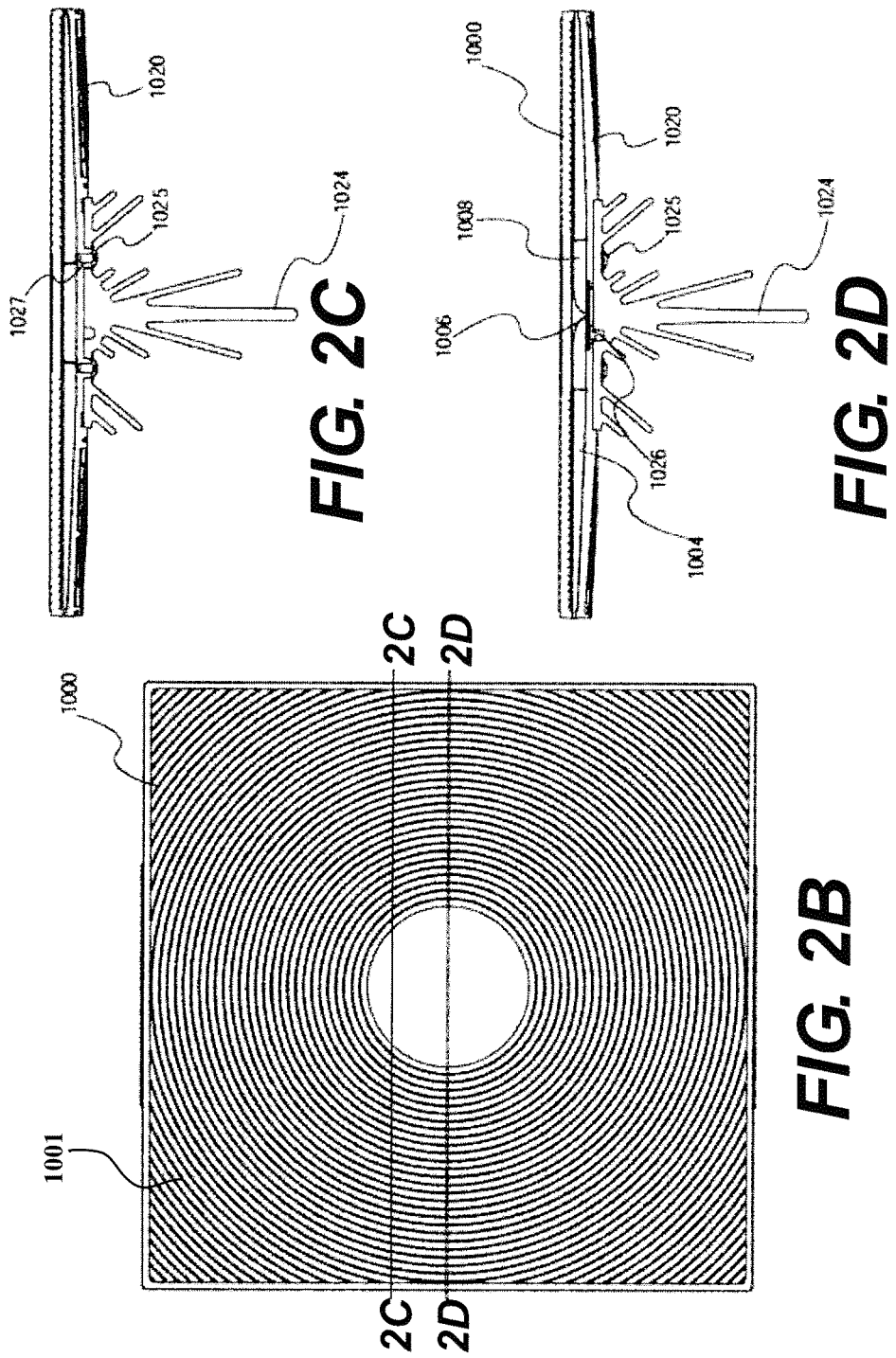

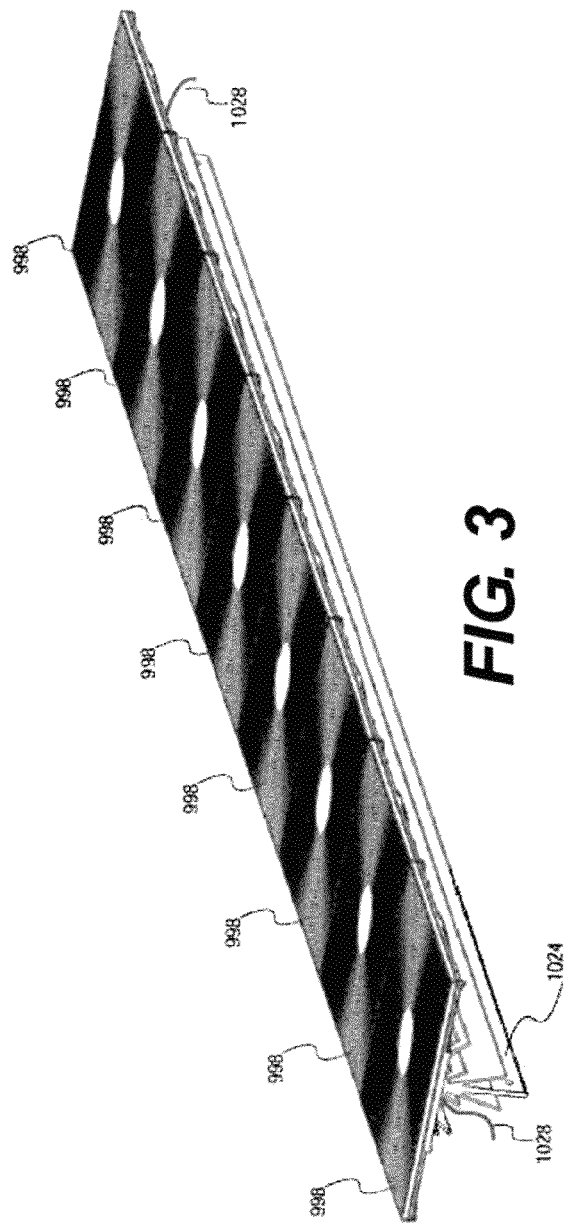

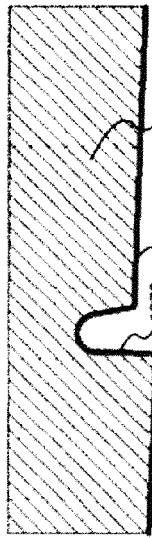 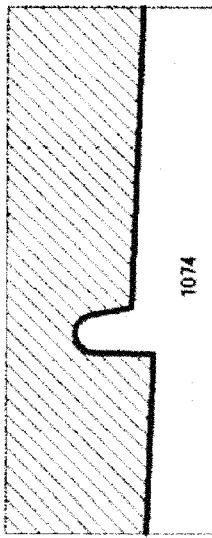 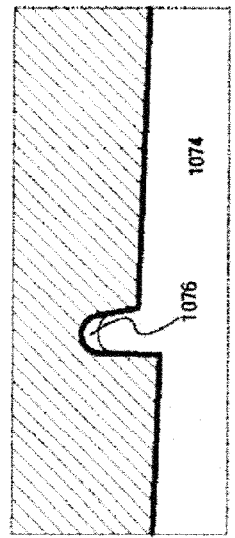 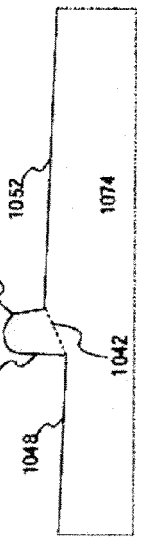
FIG. 5A  FIG. 5B  FIG. 5C  FIG. 5D
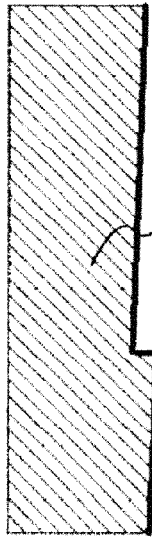 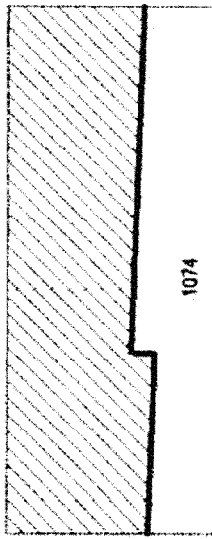 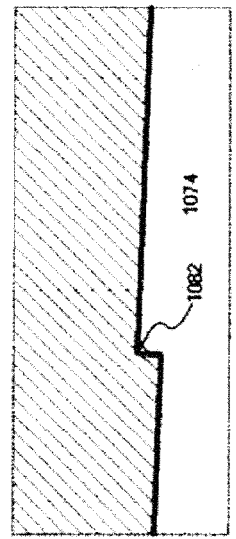 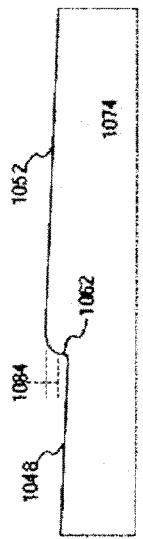
FIG. 5E  FIG. 5F  FIG. 5G  FIG. 5H

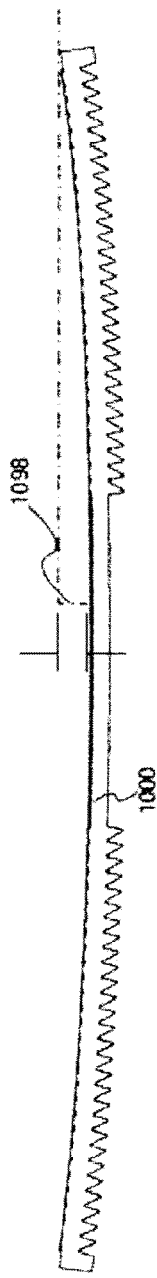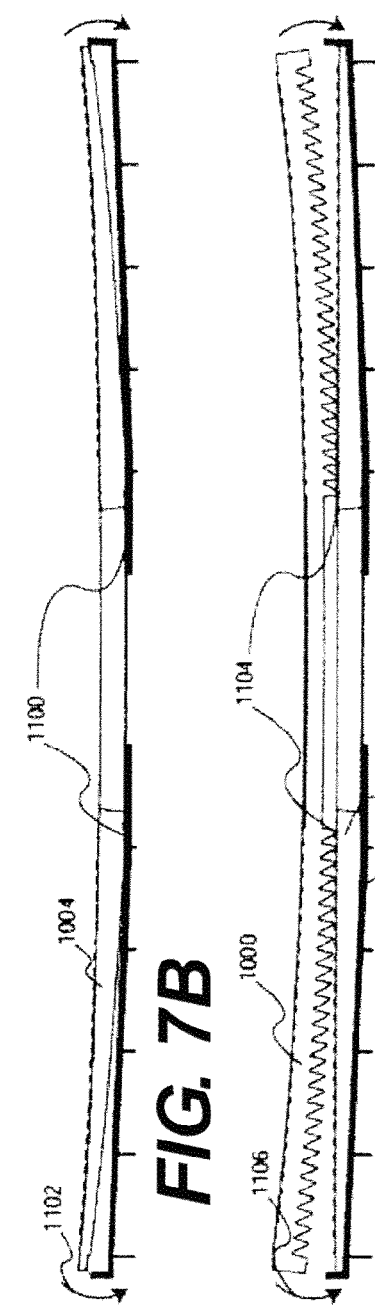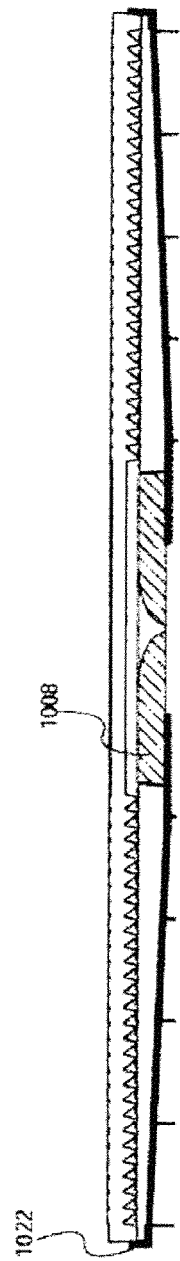
FIG. 7A  FIG. 7B  FIG. 7C  FIG. 7D

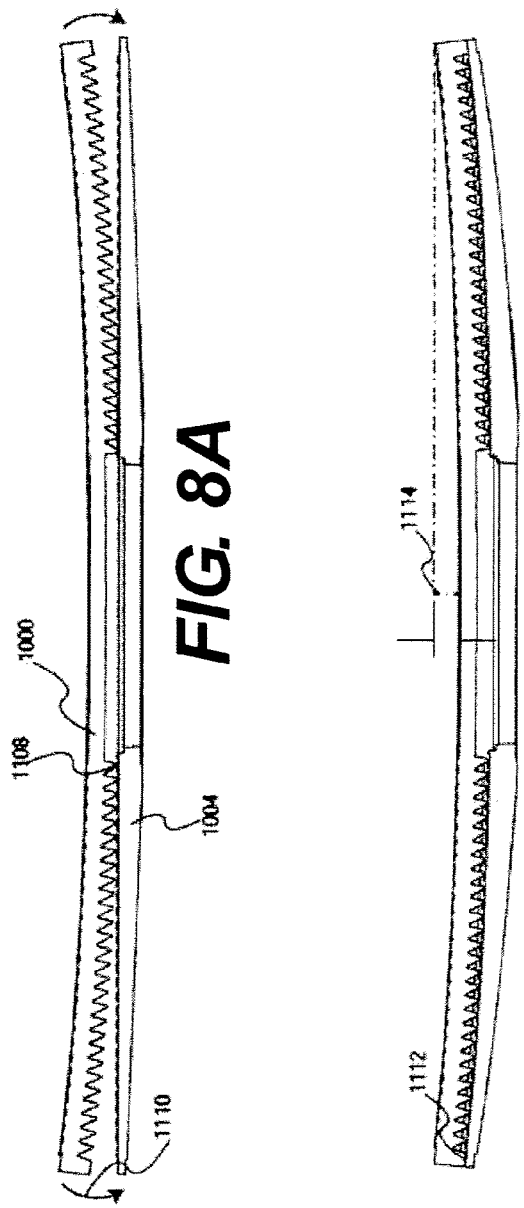

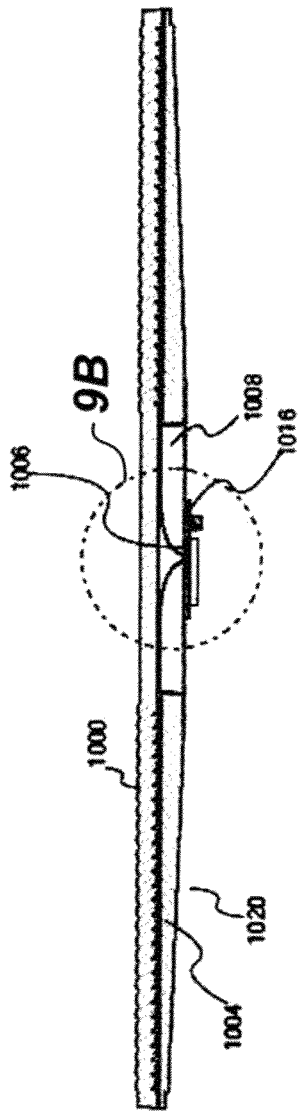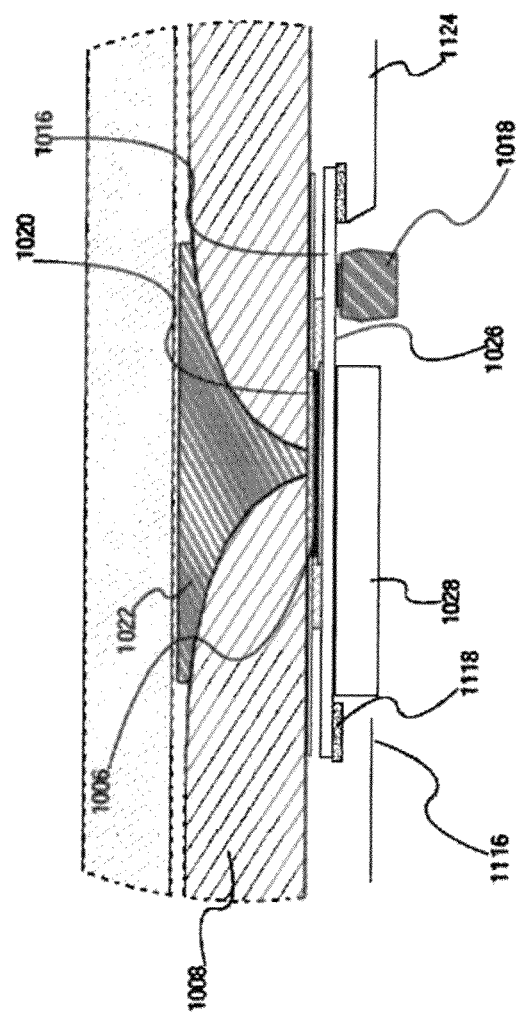

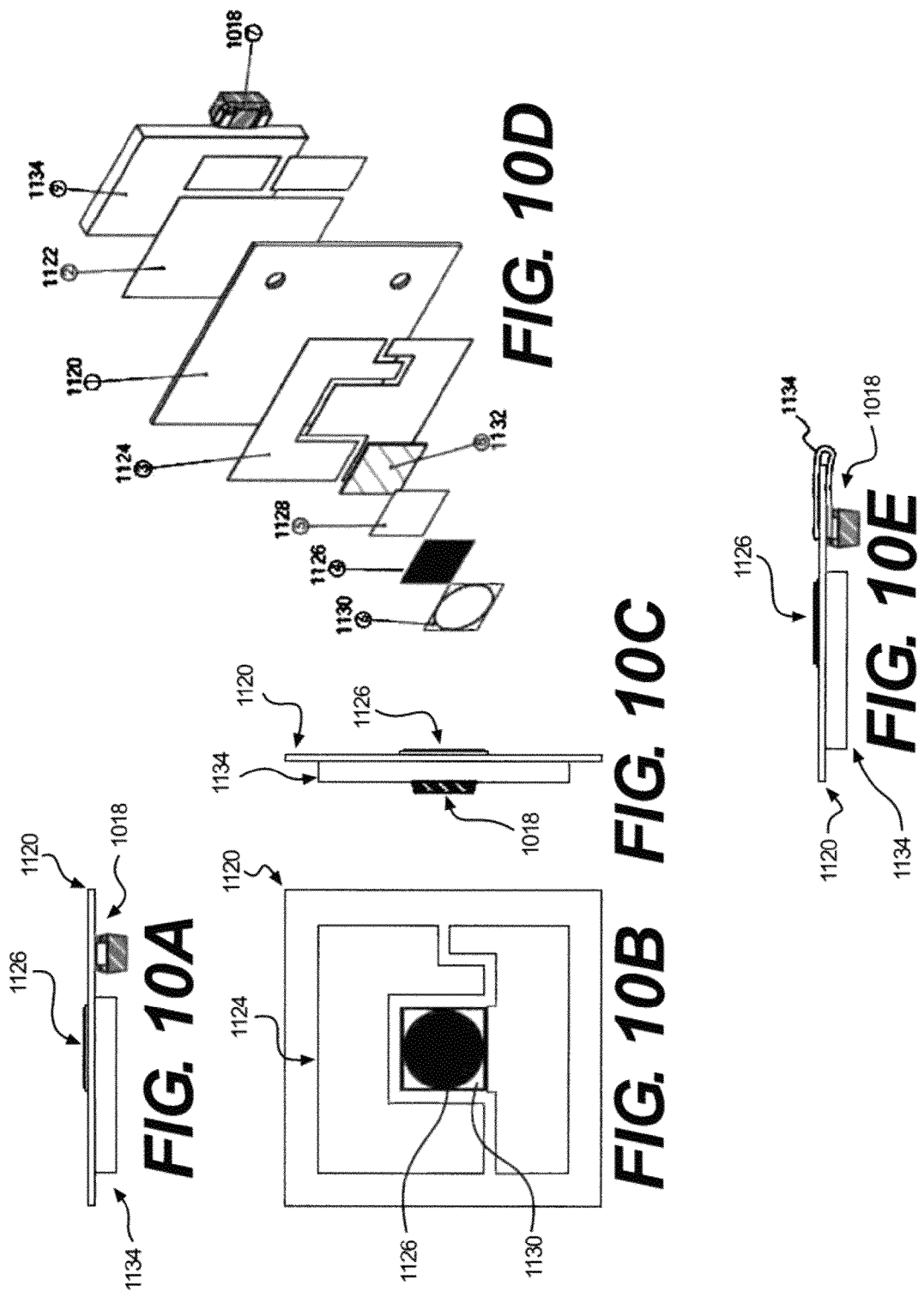

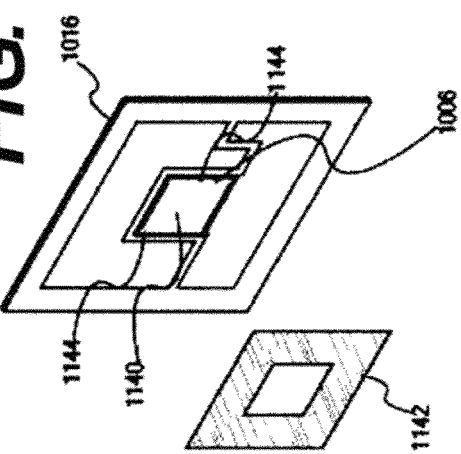
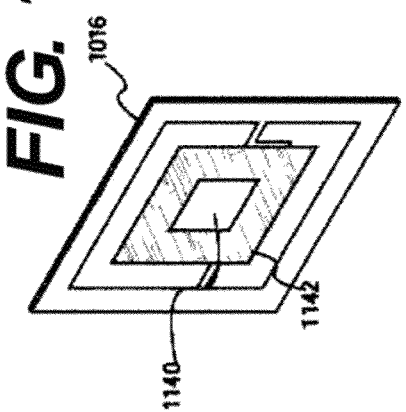
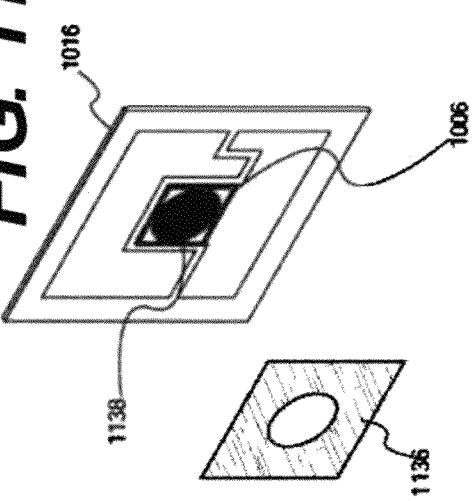
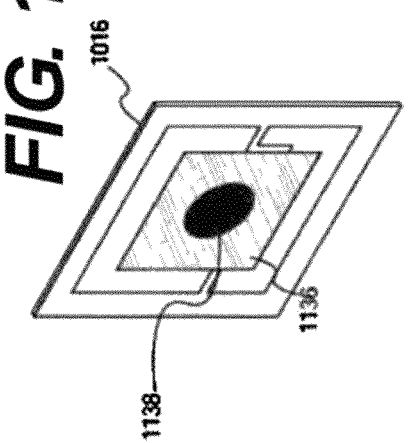

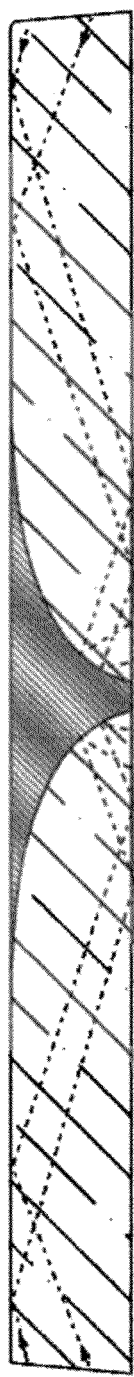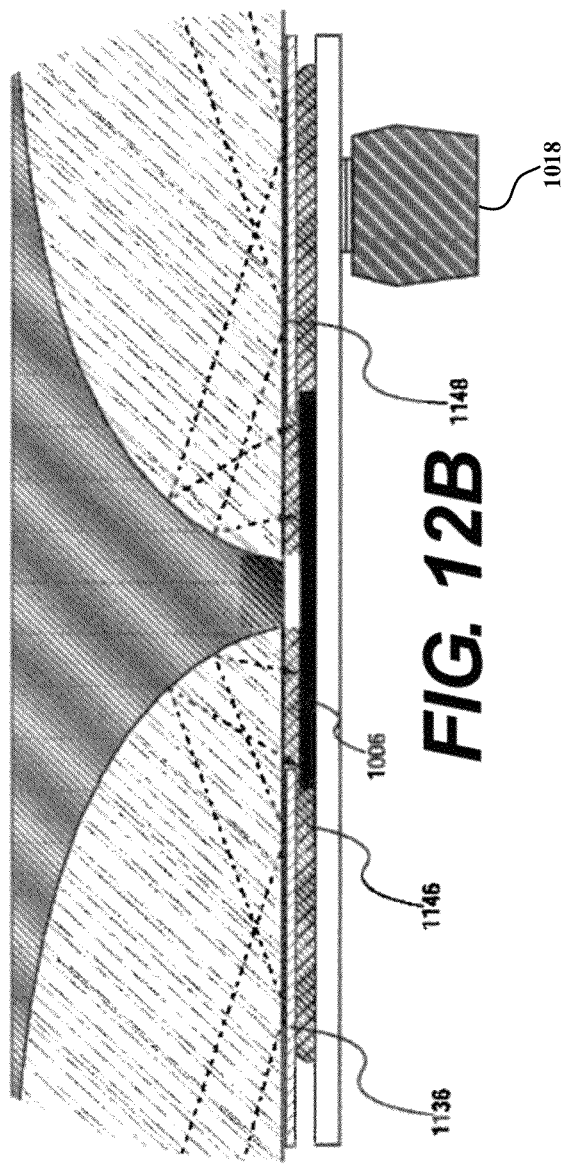

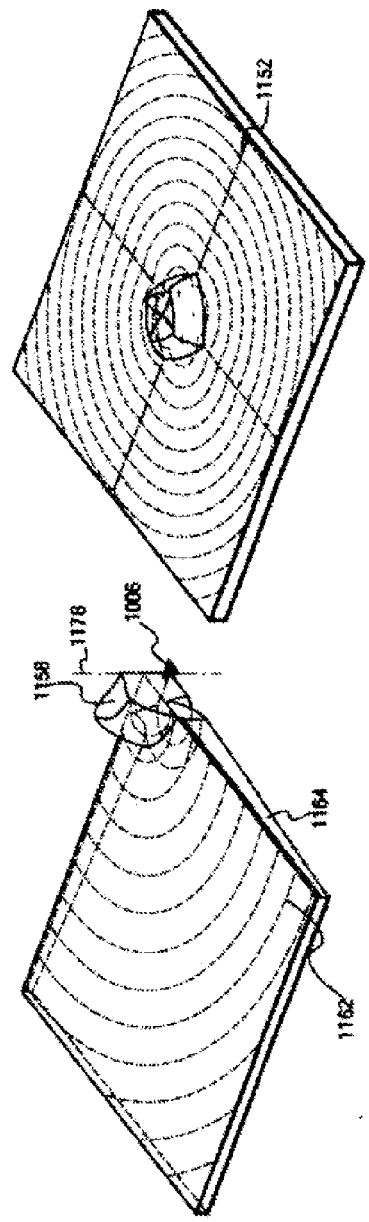
FIG. 14A
FIG. 14B
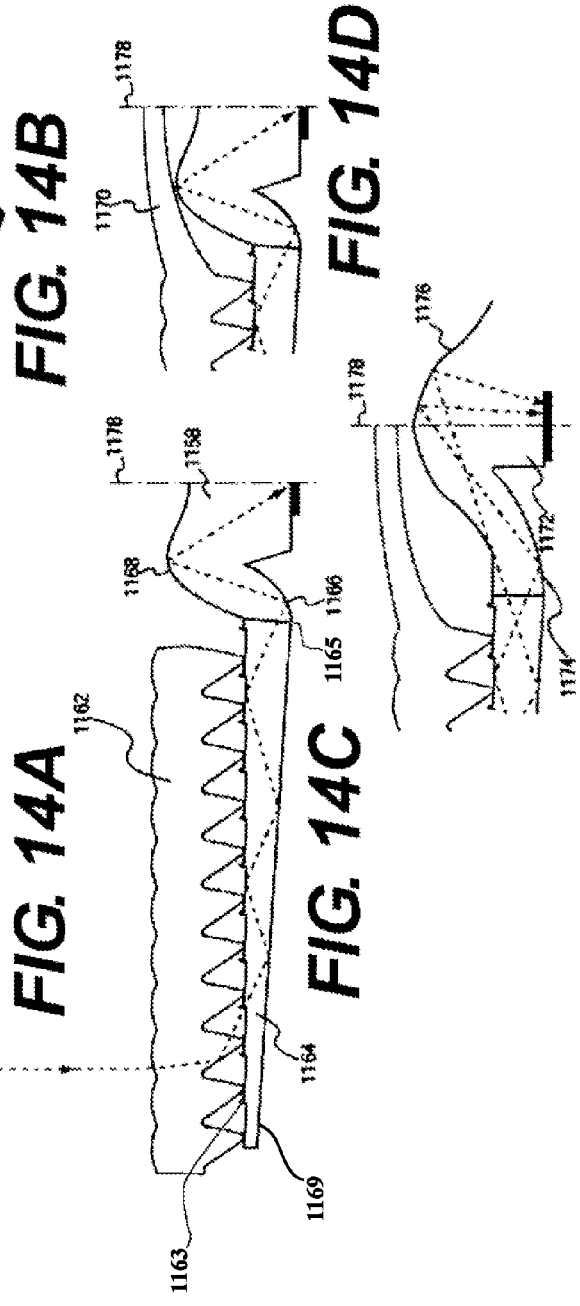
FIG. 14C
FIG. 14D
FIG. 14E

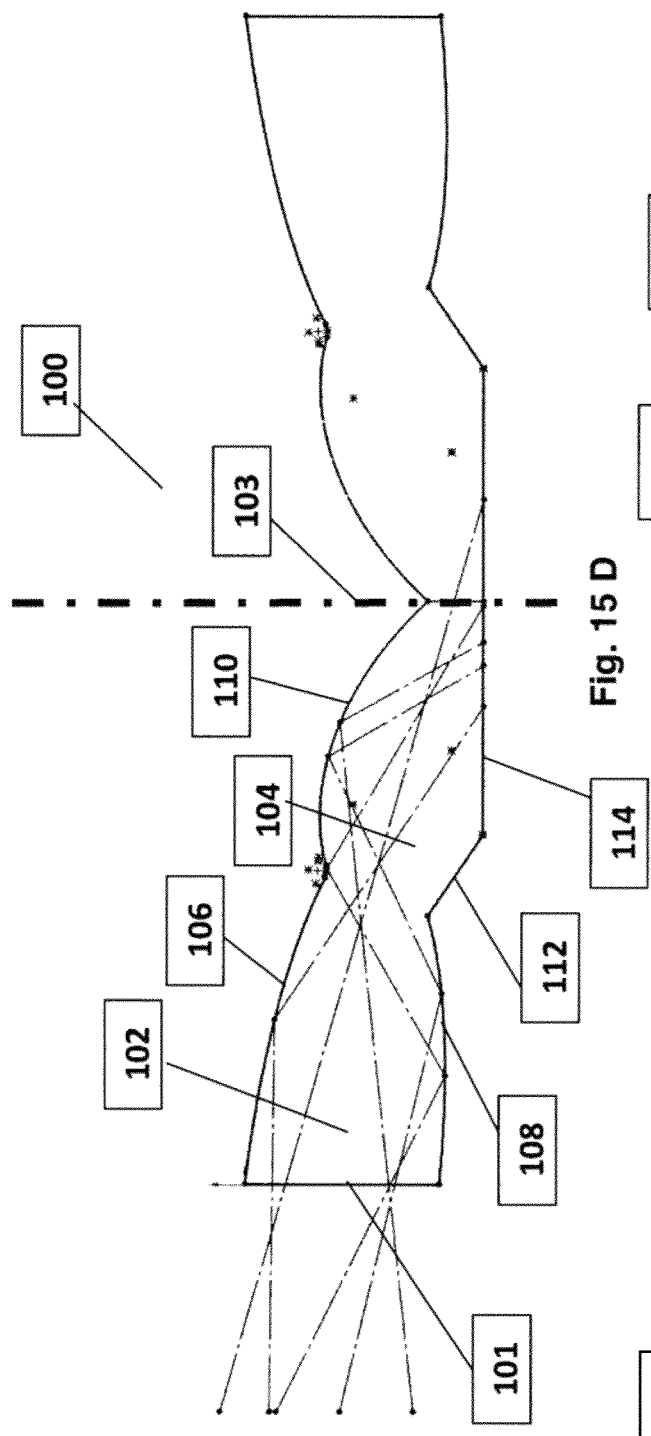
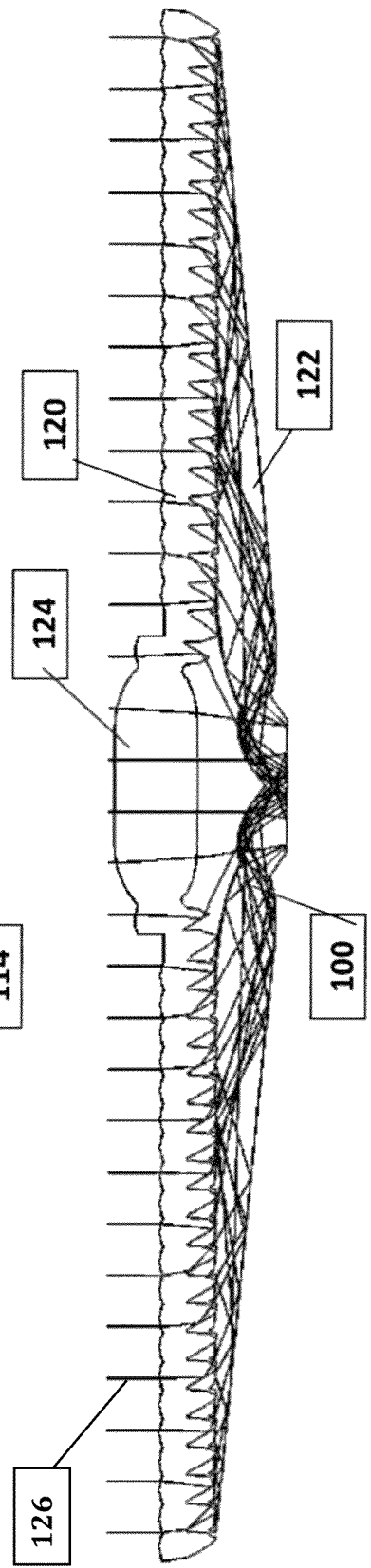
Fig. 15 D
Fig. 15 E

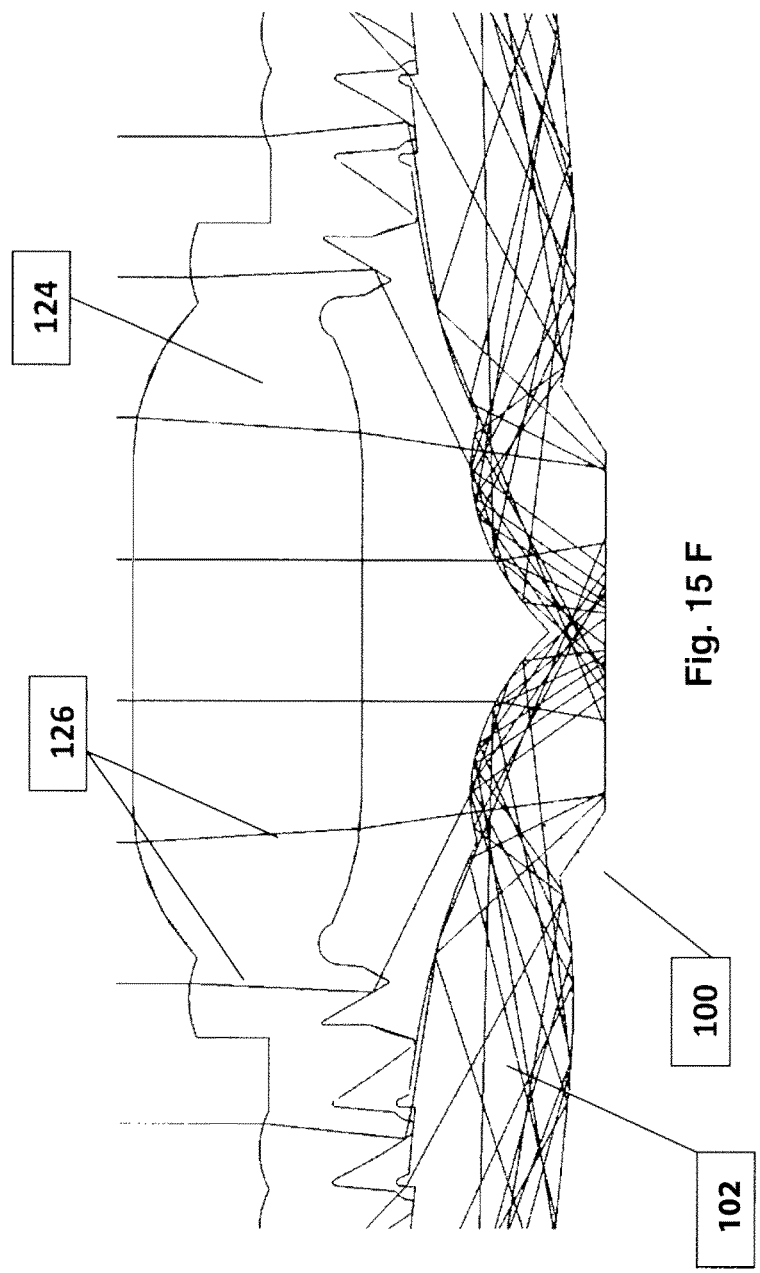

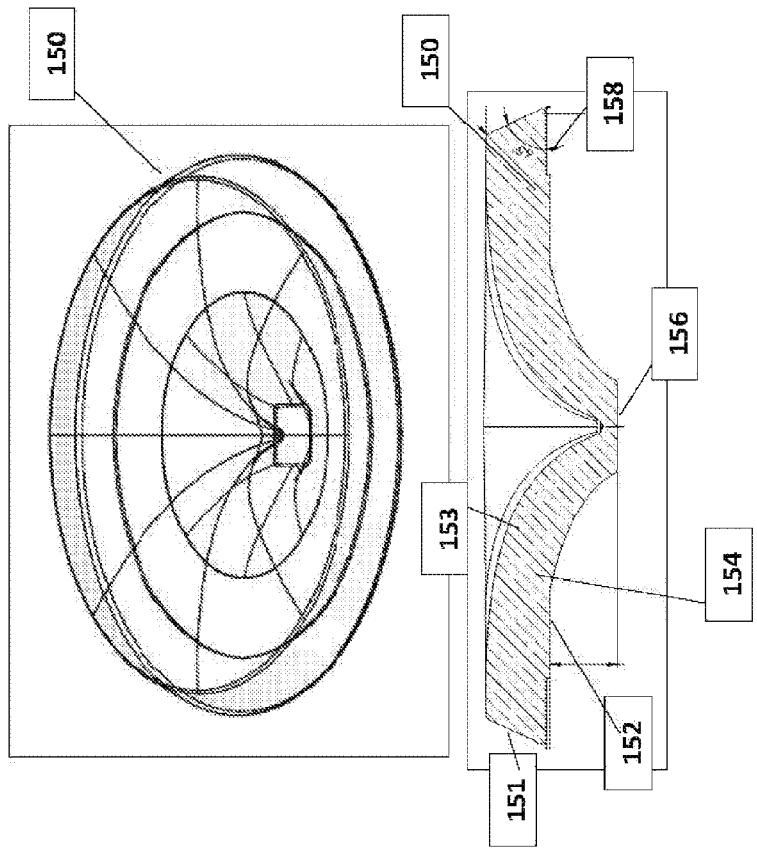
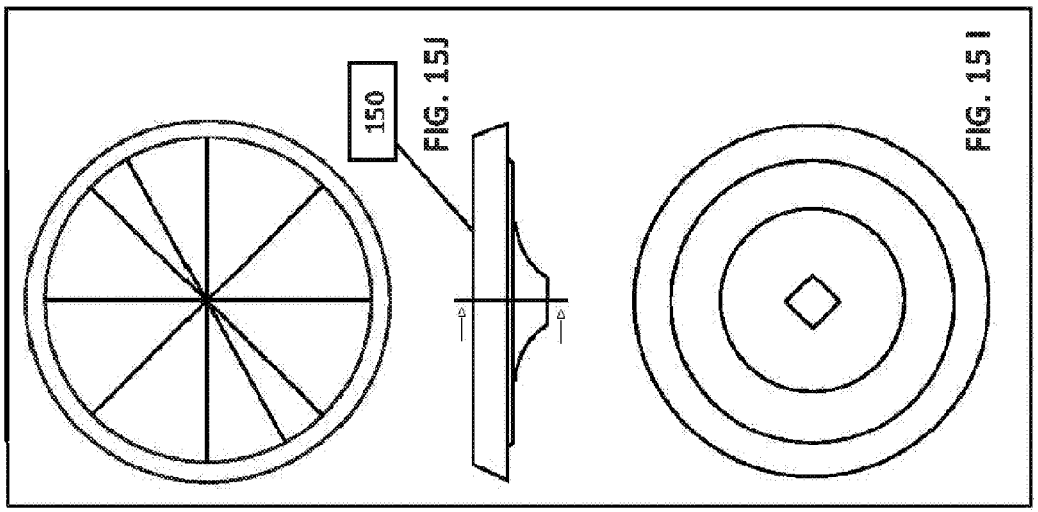

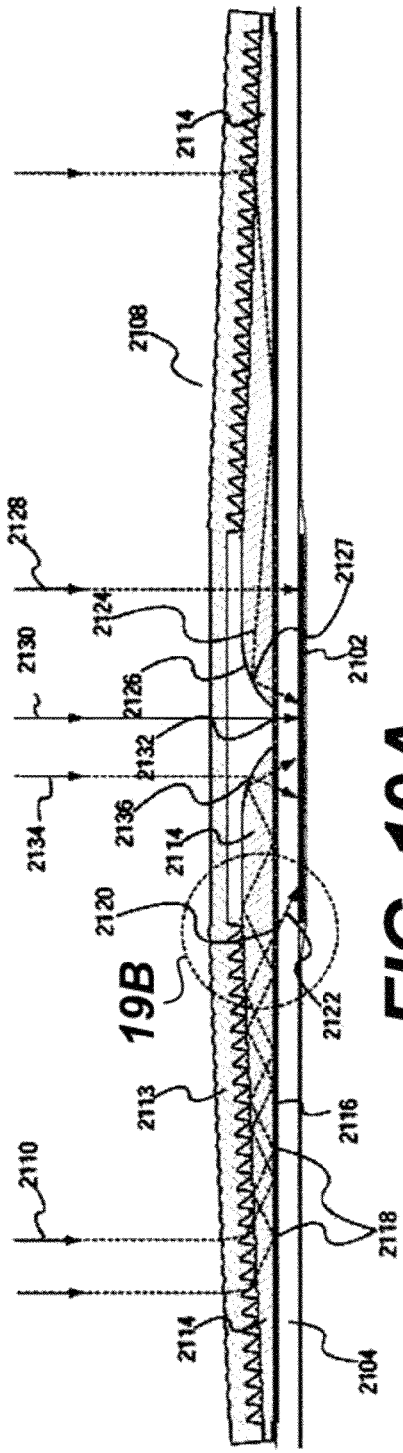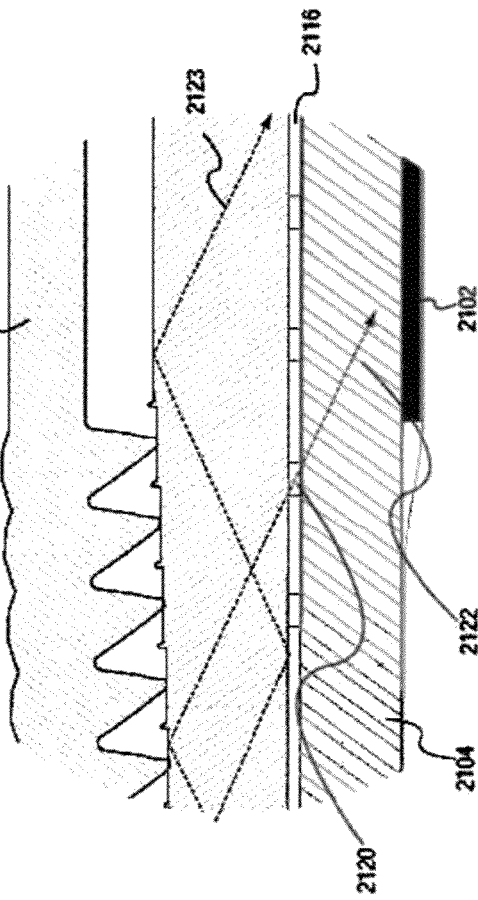

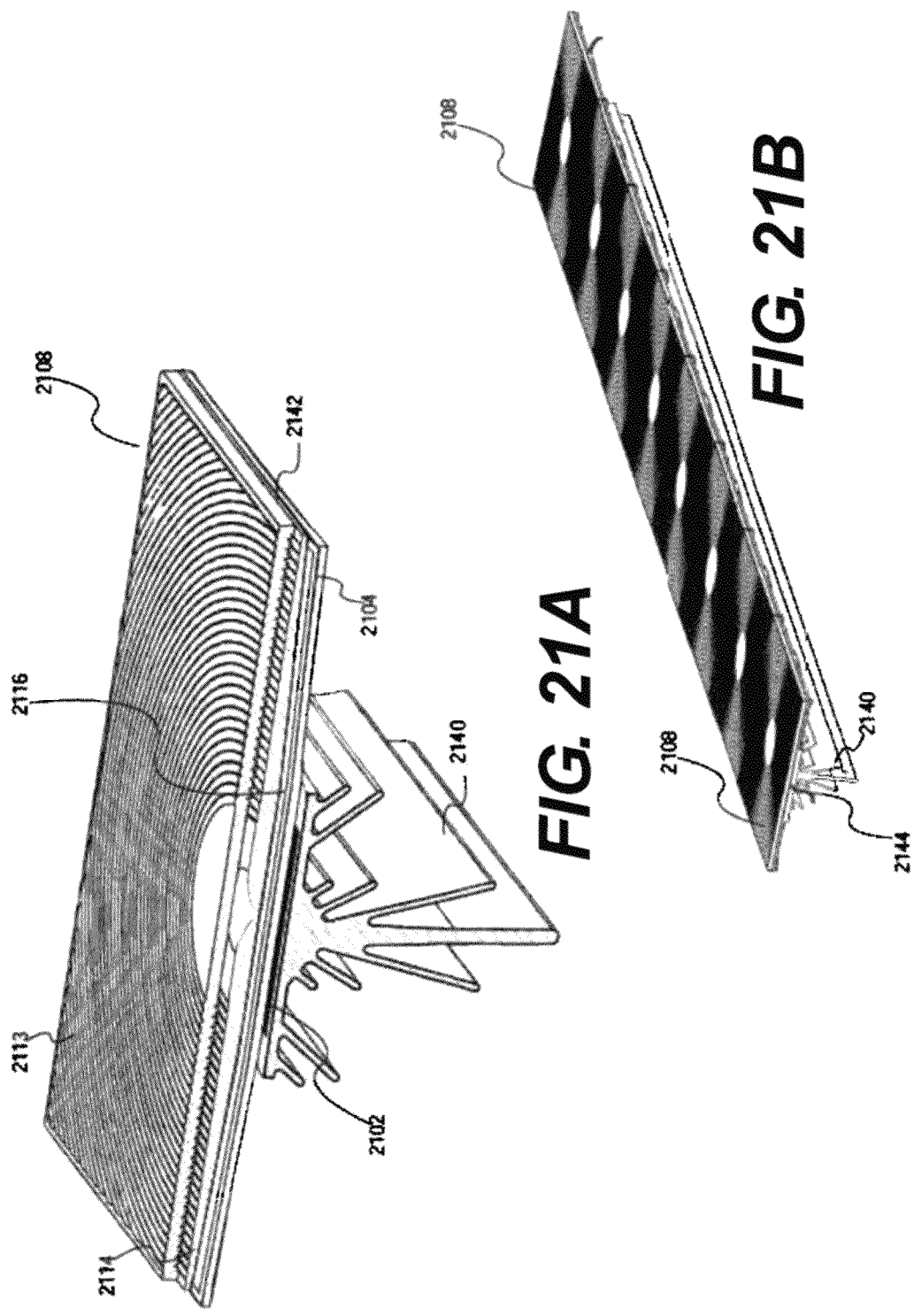

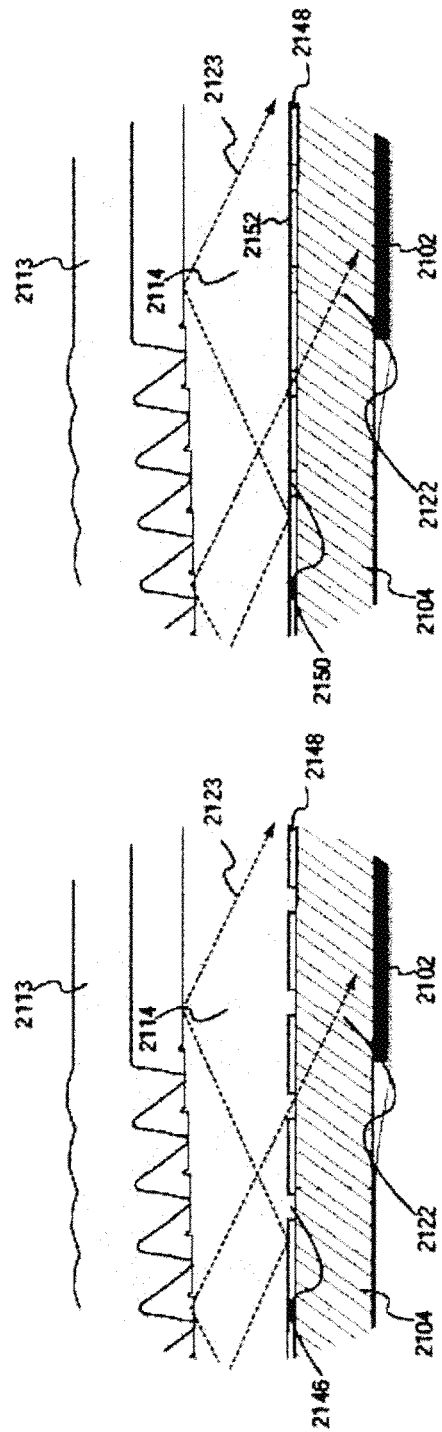
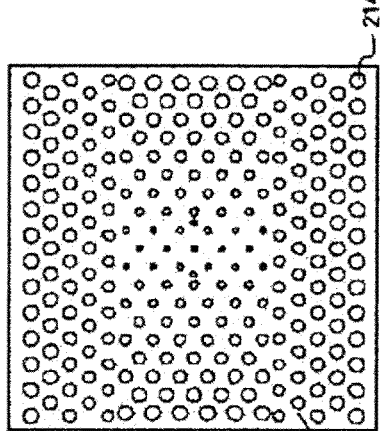
FIG. 23A
FIG. 23B
FIG. 23C

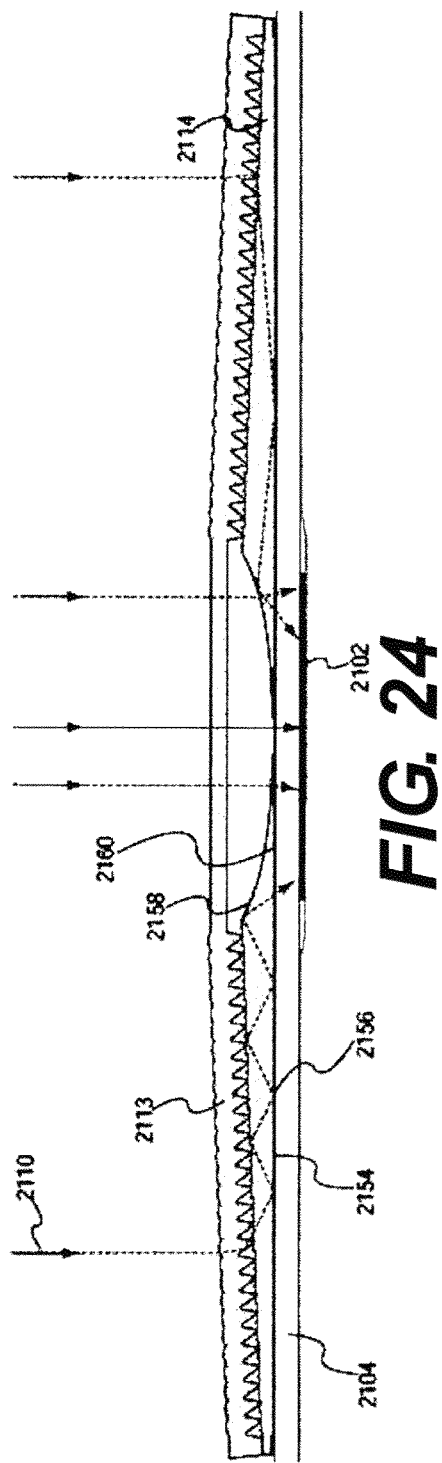

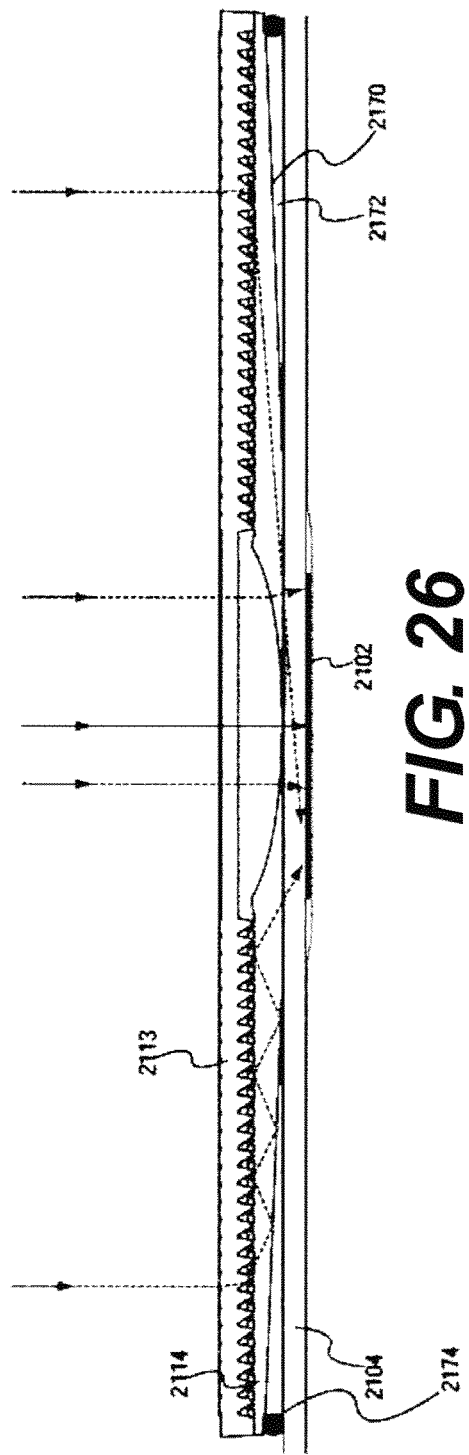

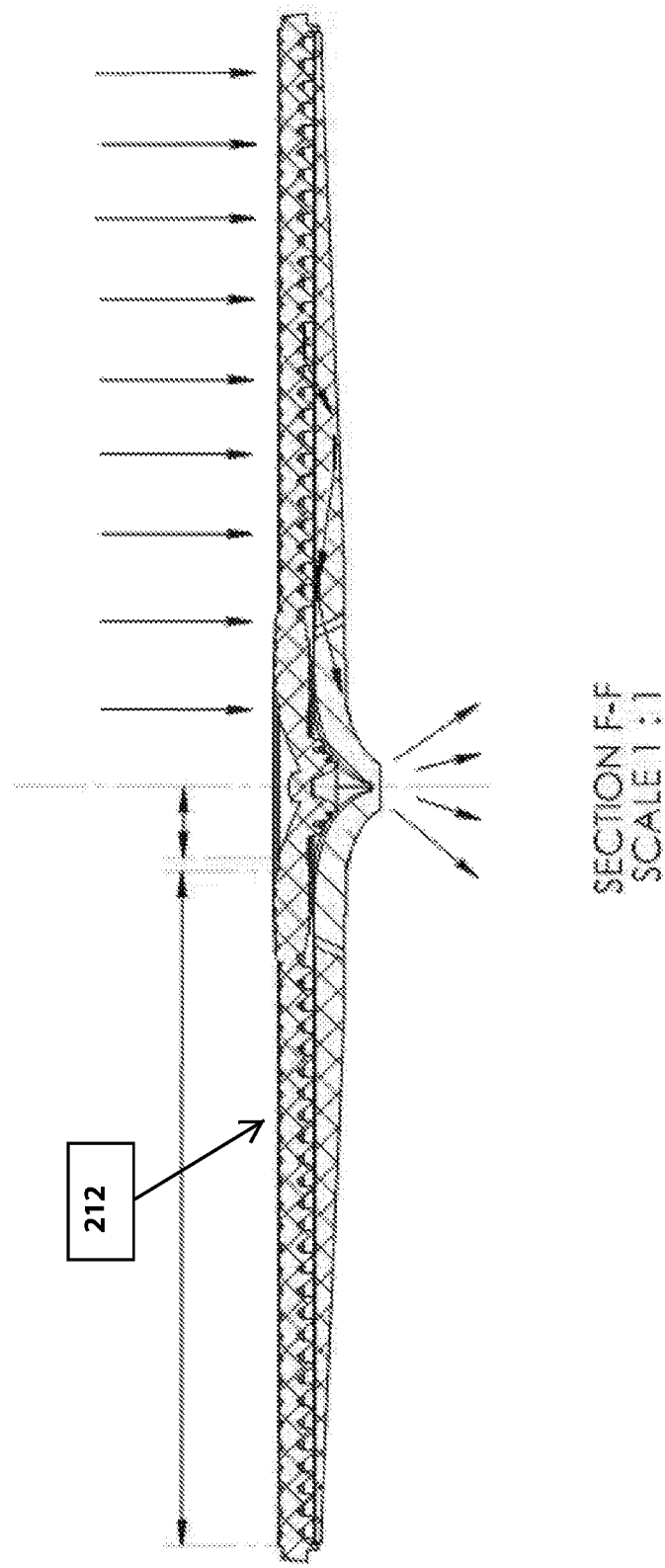

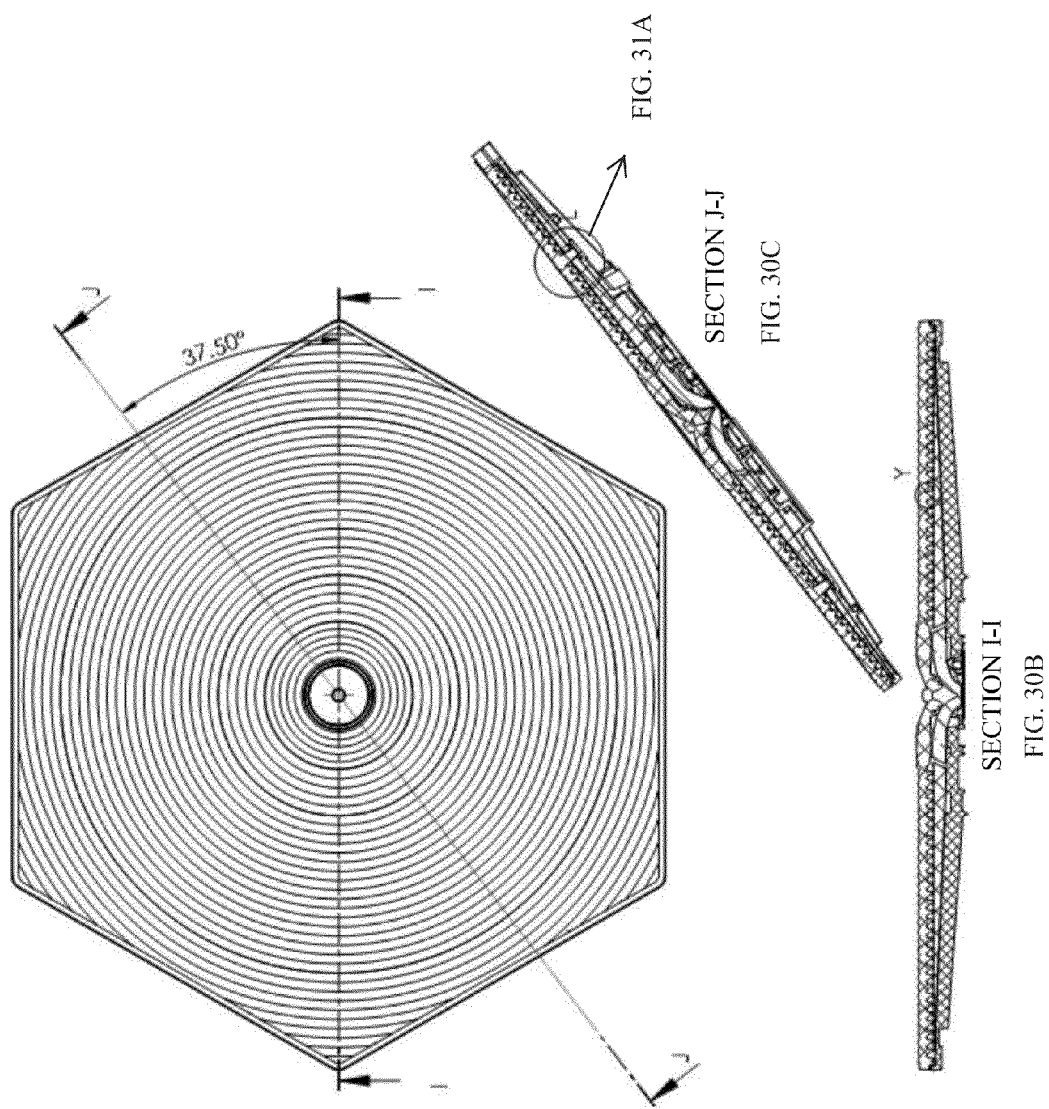

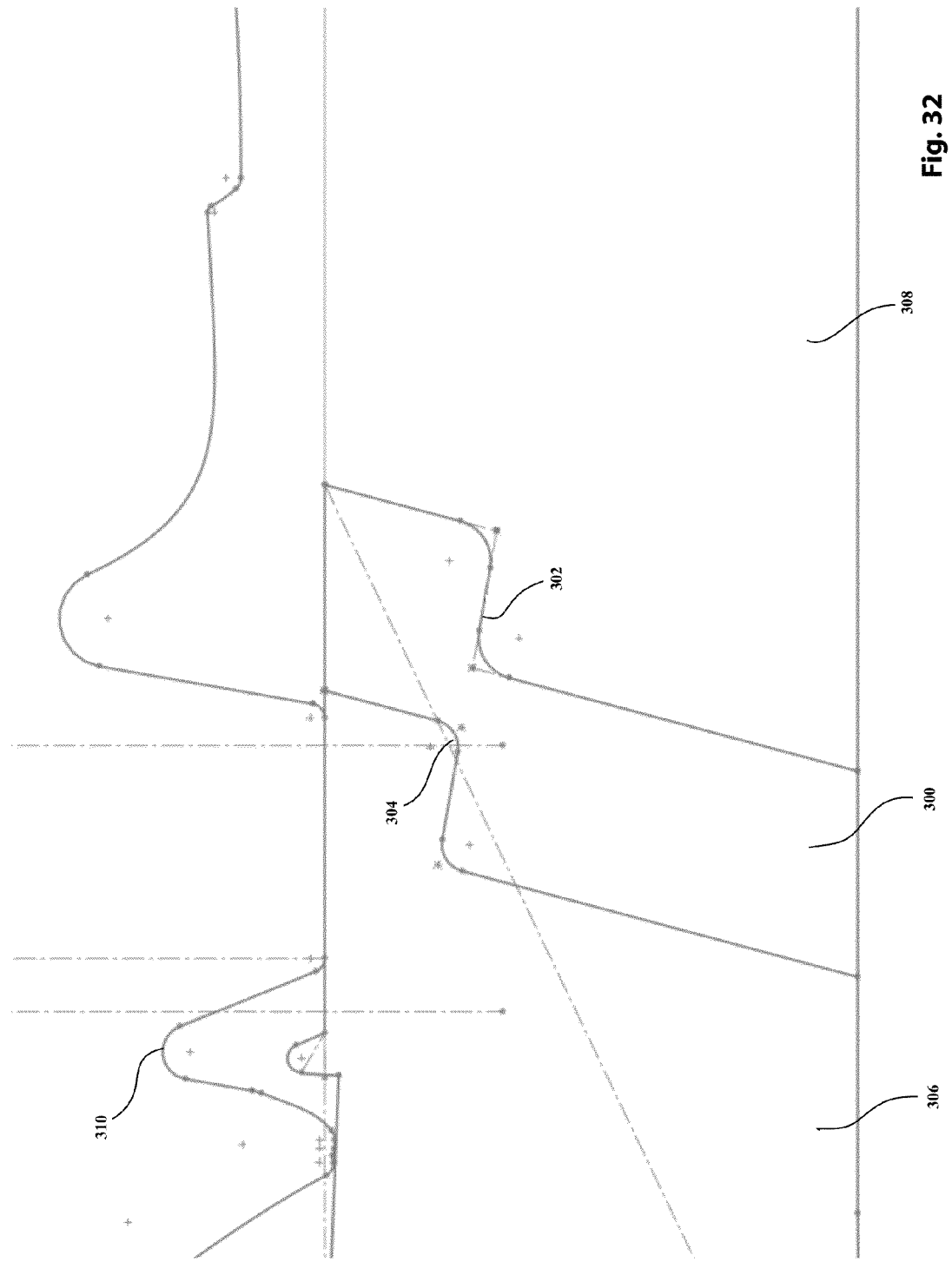

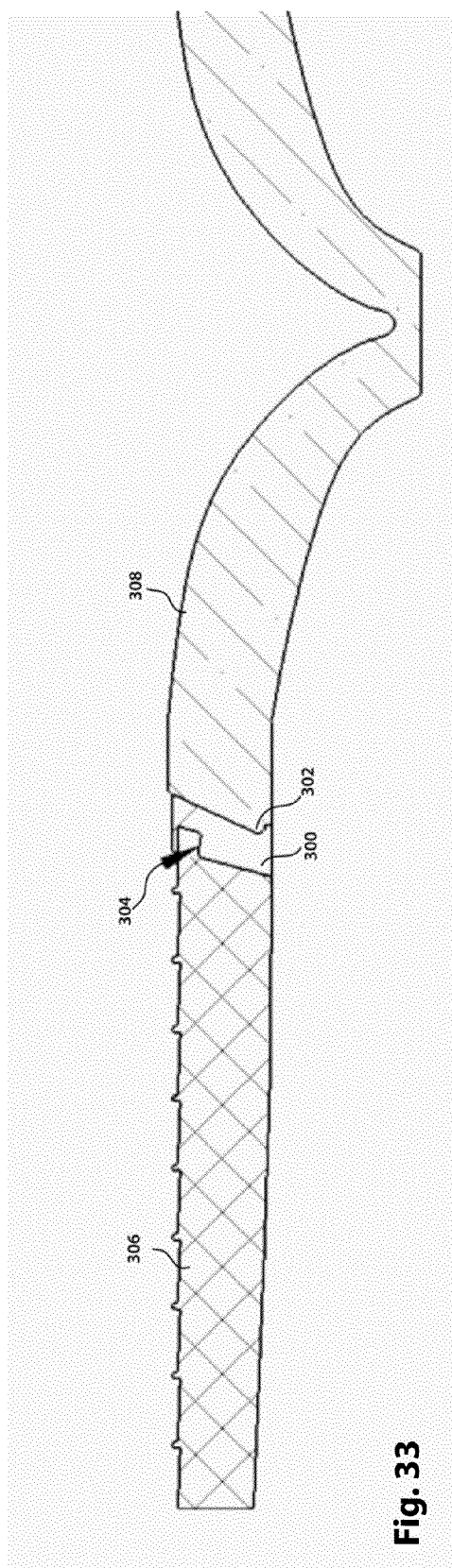

LIGHT-GUIDE SOLAR MODULE, METHOD OF FABRICATION THEREOF, AND PANEL MADE THEREFROM

CROSS-REFERENCE TO RELATED APPLICATIONS

The present application is a continuation-in-part of Ser. No. 12/705,415 filed Feb. 12, 2011, which is a continuation-in-part of Ser. No. 12/113,705 filed May 1, 2008 now U.S. Pat. No. 7,873,257. Through the '415 application, this application claims the benefit of priority to U.S. provisional applications No. 61/151,006 filed Feb. 9, 2009 and No. 61/229,542 filed Jul. 29, 2009. Through the '705 application, this application claims the benefit of priority to U.S. provisional applications No. 60/915,207 filed May 1, 2007, No. 60/942,745 filed Jun. 8, 2007, and No. 60/951,775 filed Jul. 25, 2007. The present application claims the benefit of foreign priority to International Application serial no. PCT/CA2010/001181, filed Jul. 30, 2010. All of the aforementioned applications are incorporated herein by reference.

FIELD OF THE INVENTION

The present invention relates to concentrating photovoltaic solar panels and more specifically to light-guide concentrated photovoltaic (LG-CPV) solar modules, and, to solar panels made of such modules.

BACKGROUND OF THE INVENTION

Solar panel assemblies having photovoltaic (PV) cells arrayed over a large surface area directly exposed to the sun are known. However, PV cell material is expensive and solutions have been sought to reduce the amount of PV cell material required in solar panels. One of these solutions makes use of concentrating optical elements, such as lenses and mirrors, to concentrate sunlight on a smaller surface area occupied by a correspondingly smaller PV cell. Given that the concentrating optical elements all have a non-zero focal length, they make for concentrated photovoltaic (CPV) modules that are typically bulkier than their non-concentrating counterparts. This bulkiness is disadvantageous not only in terms of the handling of the CPV modules, but also in terms of material costs. It is possible to obtain less bulky CPV modules while maintaining the same concentration factor by reducing the size of the PV cell; however, dicing PV cells into smaller cells increases the complexity and cost of the modules.

Additionally, present CPV modules typically require that the concentrating optical elements be secured in a complex structural enclosure to hold all the elements in place. This invariably adds to the weight and cost of the CPV modules, and makes for either stricter shipping requirements to mitigate risk of breakage of the assembled CPV modules, or requires that the CPV modules be shipped disassembled to their destination, thereby requiring assembly time and effort at the receiving destination. Reference is made in this regard to EP 2077586 and EP 2194584 where a Fresnel Lens focuses the light onto a an optical part that mixes the light without changing the direction of the sun light and this optical part slightly increases the acceptance angle.

Solar concentrators using optical fibres and branched waveguides have been disclosed that use flat light-guides (or waveguides) based on TIR to further reduce the overall size. They don't show a secondary optical element to change the direction of the sun light and to further concentrate the sun light onto a photovoltaic (PV) cell to increase the efficiency, add concentration and allow the PV cell to be aligned with respect to the waveguide. Reference is made in this regard to U.S. Pat. No. 3,780,722 and U.S. Pat. No. 6,730,840.

More recently advances on the compact light-guide (waveguide) TIR based solar concentrators where the TIR waveguides are optically coupled to thinner, more compact and easier to make, to couple and to assembly collecting, redirecting and focusing optical elements. Reference is made in this regard to WO 2008/131561 to John Paul Morgan, WO 2009/035986 to Ghosh and to WO 2009/063416. In these patents the optical efficiency depends on the relative position between several optical components and these patents don't show solutions to retain and align all these components.

Further improvements in the latest compact CPV modules are therefore desirable.

SUMMARY OF THE INVENTION

This invention teaches a photovoltaic light guide solar concentration apparatus having a deflecting layer, a light-guide layer optically coupled to the deflecting layer, a secondary optic and a photovoltaic cell.

In one aspect, embodiments of the present invention provides a photovoltaic light guide solar concentration apparatus having a central optical axis parallel in operation to incident sunlight, the photovoltaic light guide solar concentration apparatus comprising: a deflecting layer exposable to the incident sunlight, the deflecting layer including a plurality of focusing elements, the plurality of focusing elements being symmetrically arranged with respect to the central optical axis; a light-guide layer optically coupled to the plurality of focusing elements, the light-guide layer including a reflective surface and a plurality of opposite facets symmetrically arranged with respect to the central axis, focused sunlight from the deflecting layer entering the light-guide layer being directed and trapped by the reflective surface and the opposite facets and guided inside the light-guide layer towards an exit aperture through total internal reflections; a secondary optic coaxially located with respect to the central optical axis and coupled to the light-guide layer, the secondary optic having at least one reflective surface, the secondary optic for redirecting the light towards the exit aperture; a photovoltaic cell located at the exit aperture and on the central axis for receiving sunlight from the secondary optic within an acceptance angle relative to the central axis via an interface; and a heat sink thermally coupled to the photovoltaic cell to receive heat generated by the concentrated light projected via the secondary optic onto the photovoltaic cell.

In some embodiments the reflective surface of the secondary optic is a totally reflective surface.

In some embodiments the reflective surface of the secondary optic is a parabola.

In some embodiments the reflective surface of the secondary optic is part of a compound parabolic concentrator.

In some embodiments the reflective surface of the secondary optic is mirror coated.

In some embodiments the reflective surface of the secondary optic is a freeform surface.

In some embodiments the secondary optic is a solid component made of a sun light optically transmissive material and includes an entrance facet.

In some embodiments the secondary optic includes a non-circular exit facet.

In some embodiments an optical coupling element is positioned between the light guide layer and the secondary optic.

In some embodiments the optical coupling element includes a latch that positions the optical coupling element relative to one of the secondary optic and the light guide layer.

In some embodiments a tray secures one of the deflecting layer and the light-guide layer.

In some embodiments, the tray retains the photovoltaic cell.

In some embodiments, the tray includes supporting components to hold the secondary optic in place.

In some embodiments, one of the deflecting layer and light guide layer includes an alignment feature.

In some embodiments, one of the deflecting layer and light guide layer includes a clamping feature to secure the two layers.

In another aspect, embodiments of the present invention provides a photovoltaic light guide solar concentration apparatus having a central optical axis parallel in operation to incident sunlight, the photovoltaic light guide solar concentration apparatus comprising: a deflecting layer exposable to the incident sunlight, the deflecting layer including a plurality of focusing elements, the plurality of focusing elements being symmetrically arranged with respect to the central optical axis; a light-guide layer optically coupled to the plurality of focusing elements the light-guide layer including a reflective surface and a plurality of opposite facets symmetrically arranged with respect to the central axis, focused sunlight from the deflection layer entering the light-guide layer being directed and trapped by the reflective surface and the opposite facets and guided inside the light-guide layer towards an exit aperture through total internal reflections; a secondary optic coaxially located with respect to the central optical axis and coupled to the light guide layer the secondary optic having at least one reflective surface, the secondary optic for redirecting the light towards the exit aperture; a photovoltaic cell located at the exit aperture and on the central axis for receiving sunlight from the secondary optic within an acceptance angle relative to the central axis via an interface.

In another aspect, embodiments of the present invention provide a photovoltaic light guide solar concentration apparatus having a central optical axis parallel in operation to incident sunlight, the photovoltaic light guide solar concentration apparatus comprising: a deflecting layer exposable to the incident sunlight, the deflecting layer including a plurality of focusing elements, the plurality of focusing elements being symmetrically arranged with respect to the central optical axis; a light-guide layer optically coupled to the plurality of focusing elements, the light-guide layer including a reflective surface and a plurality of opposite facets symmetrically arranged with respect to the central axis, focused sunlight from the deflection layer entering the light-guide layer being directed and trapped by the reflective surface and the opposite facets and guided inside the light-guide layer towards an exit aperture through total internal reflections; a secondary optic coaxially located with respect to the central optical axis and coupled to the light guide layer, the secondary optic having at least one reflective surface the secondary optic to redirect the light towards the exit aperture; a photovoltaic cell located at the exit aperture and on the central axis to receive sunlight from the secondary optic within an acceptance angle relative to the central axis via an interface; a tray that secures one of the deflecting layer and the light-guide layer.

BRIEF DESCRIPTION OF THE DRAWINGS

For a better understanding of the present invention, as well as other aspects and further features thereof, reference is made to the following description which is to be used in conjunction with the accompanying drawings, where:

FIG. 2B shows top plan view of the LG-CPV solar module shown in FIG. 2A,

FIG. 2C shows a cross-section view of the LG-CPV solar module shown in FIG. 2A taken along the line 2C-2C in FIG. 2A, FIG. 2D shows a cross-section view of the LG-CPV solar module shown in FIG. 2 taken along the line 2D-2D in FIG. 2A, FIG. 3 shows a string of light-guide solar modules of FIG. 2A forming a panel, FIGS. 5A, 5B, 5C, 5D, 5E, 5F, 5G and 5H show further fabrication considerations for light-guide layers of embodiments of the present invention, FIGS. 7A, 7B, 7C and 7D show how pre-stressed parts can help maintain alignment between layers in embodiments in the present invention, FIGS. 8A and 8B further show how pre-stressed parts can help maintain alignment between layers in embodiments in the present invention, FIG. 9A shows a cross-sectional detailed view of a PV cell receiver assembly of an embodiment of the present invention, FIG. 9B shows a close-up cross-section view of the area in FIG. 9A indicated by the circle 9B, FIGS. 10A, 10B, 10C, 10D and 10E show further details regarding a PV cell receiver assembly of an embodiment of the present invention, FIGS. 11A, 11B, 11C and 11D shows a mask on the PV cell of an embodiment of the present invention made of a low index film, FIGS. 12A and 12B show how a mask of the type of FIGS. 11A-11D functions to stop light loss in an embodiment of the present invention, FIGS. 14A, 14B, 14C, 14D and 14E show details regarding four quadrant design of embodiments of LG-CPV modules of the present invention, FIG. 19A shows a cross sectional view of a single optic and a single PV cell being an embodiment of the present invention, FIG. 19B shows a close-up view of the area in FIG. 19A indicated by the circle 19B.

FIG. 21B shows a light-guide solar panel with a heat sink formed of LG CPV modules of FIG. 21A, FIGS. 23A, 23B and 23C show a close up cross sectional view of another embodiment of a single optic and a single PV cell of the present invention, FIG. 24 shows another embodiment of a light-guide solar panel with a secondary reflecting surface for spreading out the light, FIG. 26 shows another embodiment of a light-guide solar panel.

FIG. 29 shows another embodiments of the solar module in cross section, of the present invention, FIGS. 30A, 30B and 30C show another embodiment of the solar module as a view and in cross section, of the present invention.

FIG. 32 shows a cross-section view of another embodiment of a LG-CPV module of the present invention with a prism latch that optically couples the light-guide layer with the secondary optic.

FIG. 33 shows a cross-section view of another embodiment of a LG-CPV module of the present invention with an insert moulding with prism latch

DETAILED DESCRIPTION OF PREFERRED EMBODIMENTS

Generally, the present invention provides a solar energy system that uses at least one light-guide concentrated photovoltaic (LG-CPV) solar module or light-guide solar concentration apparatus that receives light at an input surface. The received light is trapped inside a dielectric, or other transparent panel, which propagates the light towards an output surface that is substantially parallel to the input surface. A photovoltaic cell harvests the light at the output surface.

Figure 1:
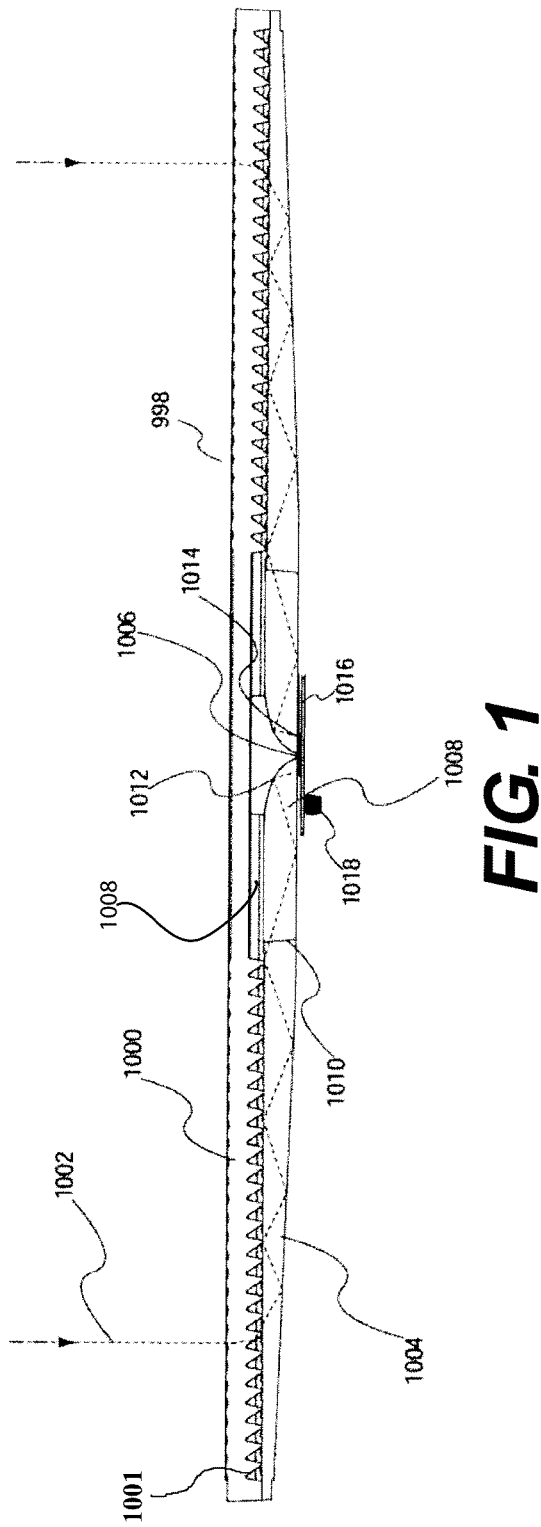
FIG. 1 shows a detailed cross section of an LG-CPV solar module being an embodiment of the present invention.

An exemplary embodiment of the LG-CPV solar module of the present invention is shown at reference numeral 998 of FIG. 1 The LG-CPV solar module is made using a deflecting layer 1000, which includes a plurality of focusing elements, and is made of a moulded polymer for receiving incident sunlight 1002 and inserting it into the light-guide layer 1004, which is made of a moulded polymer for trapping light and conducting it in a slab light-guide towards a central photovoltaic cell 1006. The light-guide layer is optically coupled to the deflecting layer and to a secondary optic 1008 which is coaxially located with respect to the central axis of the solar module and concentrates light onto the PV cell. This secondary optic is either made of a material capable of withstanding high flux densities such as glass, moulded silicone, or a moulded polymer. The interface 1010 between the glass secondary optic and the light-guide layer is made using an optical coupling element, which in an optical bonding agent, such as transparent silicone, in order to minimize the Fresnel back reflections that can occur at this interface. Alternately, the secondary optic and the light-guide layer can be moulded during the same step in a co-moulding operation. The secondary optic has a curved face 1012 that, on reflection, focuses light traveling in the secondary optic down onto the photovoltaic cell. This face can be mirrored, or, a mirror coating can be applied to an adjacent component that conforms to the face 1012. The interface between the secondary optic and the PV cell 1014 is made using an optical encapsulant. This performs the dual function of protecting the PV cell from moisture or contamination by encapsulating it and minimizes Fresnel back reflections at this interface. The optical encapsulant can be made out of silicone, especially a silicone that does not harden significantly in order to avoid creating stress on the PV cell due to mismatched coefficients of thermal expansion between the secondary optic and the cell. The PV cell sits on a printed circuit board 1016. This printed circuit board can be made using ceramic which is matched in terms of coefficient of thermal expansion with the PV cell. Often with triple junction cells, the cells are mounted on a printed circuit board with a bypass diode. Because there is very little space between the PV cell and the optics, the bypass diode 1018 can be mounted on the backside of the printed circuit board.

Figure 2A:
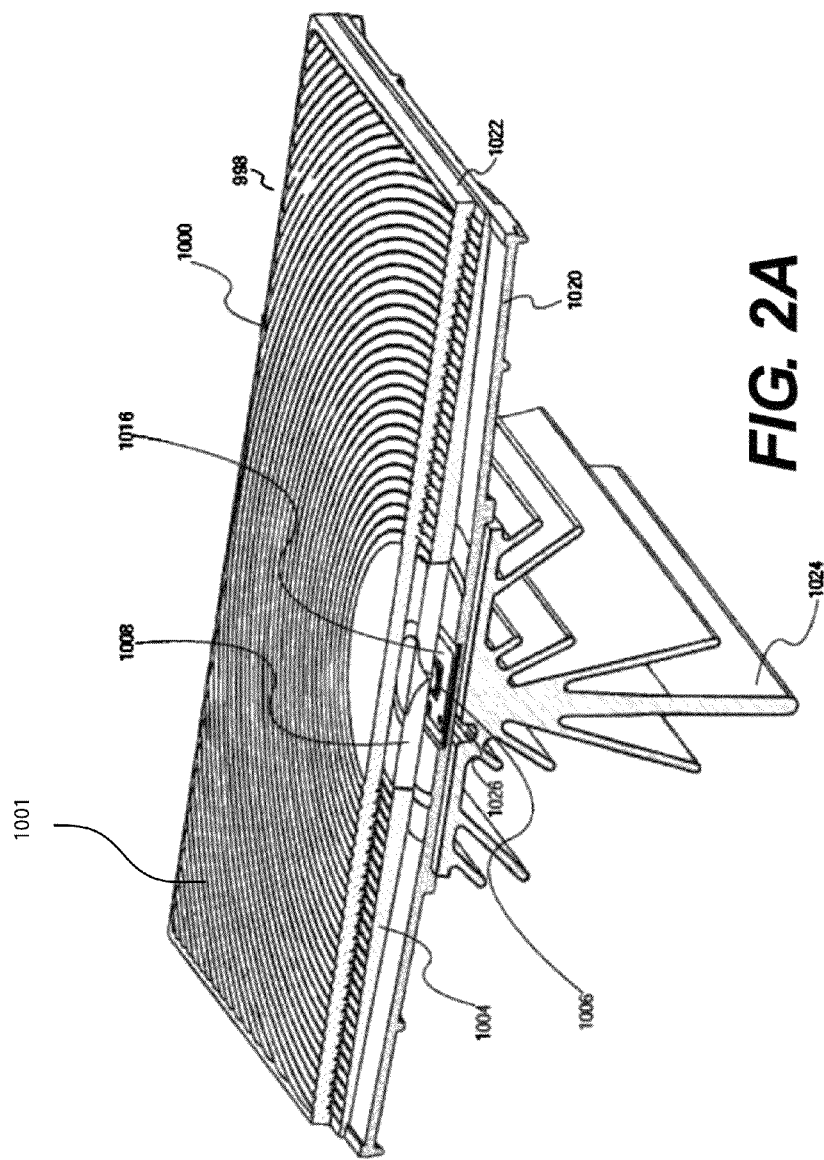
FIG. 2A shows a cut away perspective view of the LG-CPV solar module similar to FIG. 1 in three dimensions (shown with a heat sink)

A practical realization of the design from FIG. 1 is shown in a perspective cross-sectional view in FIG. 2A. The deflecting layer 1000, the light-guide layer 1004, the secondary optic 1008, and the printed circuit board (PCB) 1016 are all held in place by a tray 1020. The tray can be made by moulding, and it can be made out of a polymer with the same coefficient of thermal expansion as the deflecting layer and the light-guide layer. In this way, the three largest components will have the same coefficient of thermal expansion, which will enable them to expand at the same rate and maintain alignment with each other while also not experiencing excessive stress. Furthermore, if the three components are made of the same material, or of materials that are compatible, they can be welded or bonded at their outer flange 1022. All three moulded pieces, the deflecting layer, the light-guide layer, and the tray, can have flanges that allow them to be ejected from the mould and this same flange can be used to bond the components together. The light-guide layer can also be smaller than the other components so that the deflecting layer bonds directly to the tray effectively sandwiching the light-guide layer in place and sealing it in place. The module 998 made of optics, a tray and cell can be mounted on a heat sink 1024. The heat sink shown is an extruded aluminum heat sink. A channel 1026 is left for the diode on the bottom of the PCB and can also be used to conduct wires between neighboring light-guide solar modules 998. The bottom of the PCB passes through a hole in the tray and makes contact with the heat sink. The PCB is connected to the heat sink using a thermally conductive agent, such as a thermal epoxy, thermally conductive silicone, thermal grease, or another thermal conductive agent. The remaining gap between the heat sink and the tray can be filed with gap filler that has adhesive properties, such as a urethane or silicone based material. Additional hardware, such as screws, rivets, or bolts, can be used to join the panels 998 to the heat sink 1024. For example, fasteners are shown in FIG. 2C and FIG. 2D 1025 that go through holes 1027 in the heat sink.

Multiple panels 998 can be so mounted onto a single heat sink 1024 to make a row of modules or a string to form a solar panel, such as shown in the exemplary embodiment of FIG. 3. The groove in the heat sink that allows for the diodes can be used to conduct wires from one printed circuit board to the next so that at the ends of the string electrical leads 1028 may come out for electrical interconnection with more strings and into larger solar panel arrays.

During the assembly of the LG-CPV module, it is key that the deflecting layer and the light-guide layer are maintained in close contact at all points along their facing surfaces. This is because the functional units on the light-guide layer and on the deflecting layer must work together, the deflecting layer must focus the light so that it is incident on the insertion facet 1040 of the light-guide layer and so that it passes through the exit apertures into the light-guide layer.

Consider the functional units from FIGS. 4A, 4B, 4C, and 4D. The functional unit 1030 consists of a deflecting component 1032 acting in total internal reflection (TIR) that takes incident light 1002 and focuses it to near a point 1034. A convex element 1036 partially focuses the incident light 1002 onto a deflecting surface 1038 acting in TIR, which focuses the light to near the same focal point 1034.

Figure 4A:
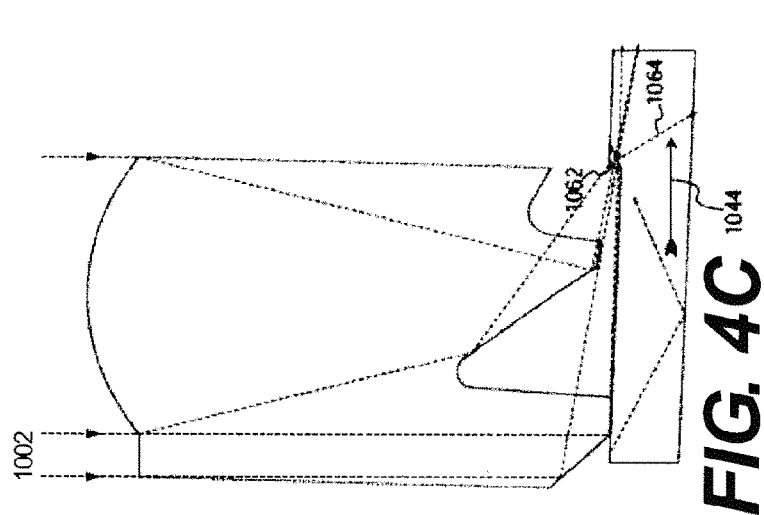
FIGS. 4A, 4B, 4C and 4D show fabrication considerations for a single functional unit of an embodiment of an LG-CPV module of the present invention.
Figure 4C:
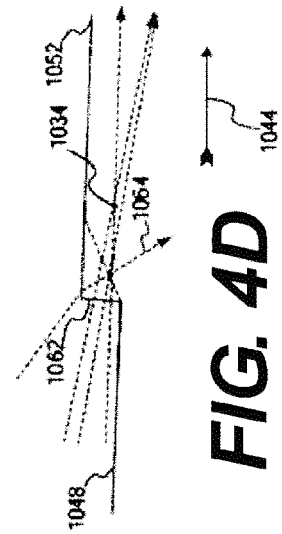
Figure 4B:
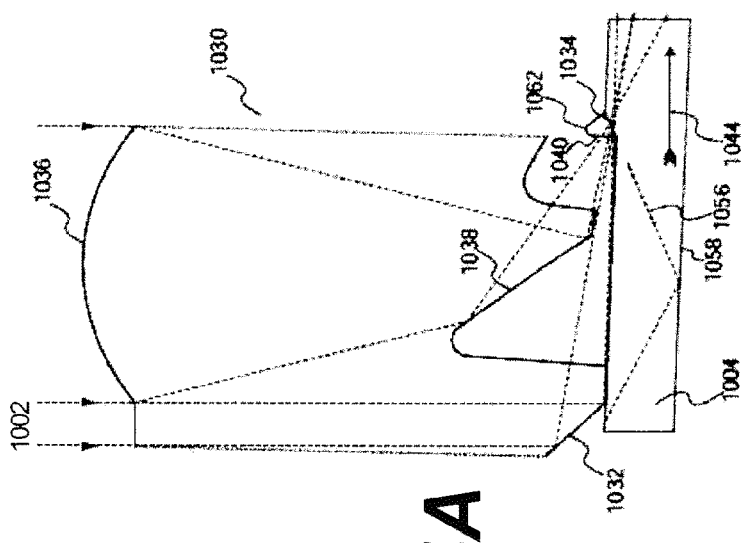
Figure 4D:
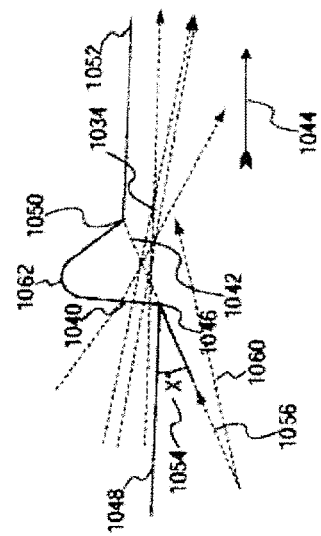

This point 1034 is inside the light-guide layer 1004, and just beyond an insertion facet 1040. Note that then aperture that the light must pass through to enter the light-guide layer is denoted by the dashed line 1042 and not by the insertion facet 1040. Denoting the downstream direction by the arrow 1044 the aperture is defined by an imaginary line 1042 drawn from the end-point 1046 of one the top facet 1048 of the light-guide layer to a point 1050 on the next downstream top facet 1052 of the light-guide layer. The acute angle X degrees 1054 that the line 1042 makes with the top facets 1048 and 1052 (which are parallel with each other) is chosen such that the steepest ray 1056 traveling in the light-guide layer (the ray which reflects of the bottom facet 1058 and the top facets the closest to normal) makes an acute angle with the top facets less than or equal to the angle made by the line defining the aperture. An exemplary ray 1056 is shown which is parallel to the line defining the aperture; a second exemplary ray 1060 is shown whose acute angle with the top or bottom facets is less than that of the line defining the aperture. Having a ridge 1062 on the insertion facet 1040 of the light-guide layer is important. If there is no ridge, such as is shown in FIGS. 4C & 4D then the effective aperture is reduced to the size of the insertion facet 1040 which is smaller than the effective aperture 1042 when there is a positive ridge such as in FIGS. 4A & 4B. The effect of shrinking the aperture is that some rays, such as for example 1064, which were previously coupling into the light-guide layer will now strike the top facet 1052 instead of an insertion facet 1040 and as such will be at an angle such that it will not TIR inside the light-guide layer and will instead escape. Shrinking the aperture also reduces the angular acceptance of the system.

Using an insertion element on the light-guide layer that features a ridge 1062 or a bump is advantageous from a manufacturing perspective. Consider FIGS. 5A-5G. FIG. 5A shows a portion of a mould 1066 to make a light-guide layer. The mould features optically polished surfaces 1068 and 1070 to produce the top of the light-guide layer that correspond to the surface 1048 and 1052 from FIG. 4B. The mould also features an optically polished surface 1072 to produce the insertion facet 1040. FIG. 5B shows how the mould would appear if the polymer, 1074, completely filled the mould. However, as is well understood in injection moulding, it is typical for air to become trapped inside the mould, as is shown at 1076 in FIG. 5C. This deforms the produced part 1078 shown in FIG. 5D when compared with the mould. However, as shown in FIG. 5D, the functional portions, being the top facets 1048, 1052, the insertion facet 1040, and the aperture 1042, are still properly formed. By contrast, consider the mould 1080 in FIG. 5E which attempts to produce a square step. When the polymer 1074 fills the mould if a small amount of air 1082 is trapped it will round off the insertion facet 1062. This shrinks the effective portion of the insertion facet 1062 by an amount indicated by 1084. This reduction in insertion facet size increases the required manufacturing tolerances and reduces angular acceptance by requiring that light focus through a very small window. When a bump or ridge is used, by contrast, the aperture for insertion into the light-guide layer remains wide irrespective of manufacturing.

Figure 6C:
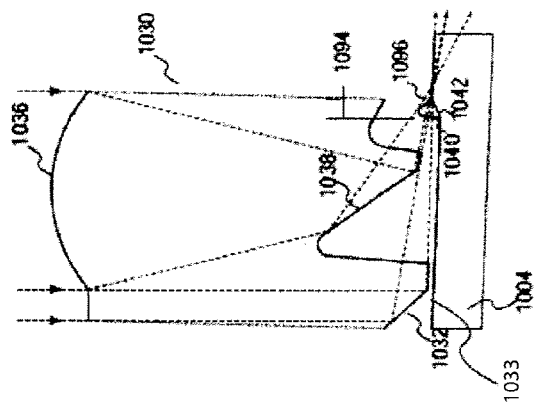
FIGS. 6A, 6B and 6C show issues related to misalignment of light-guide solar module layers of embodiments of the present invention.
Figure 6B:
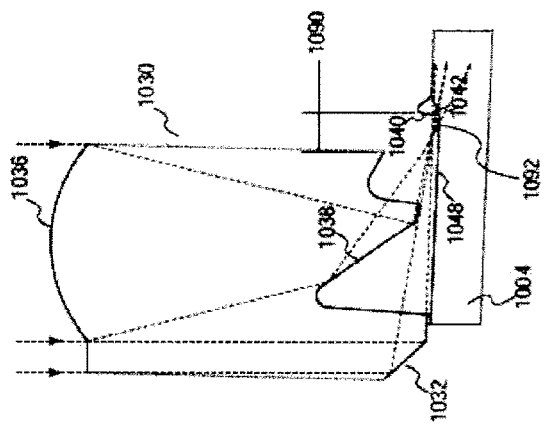
Figure 6A:
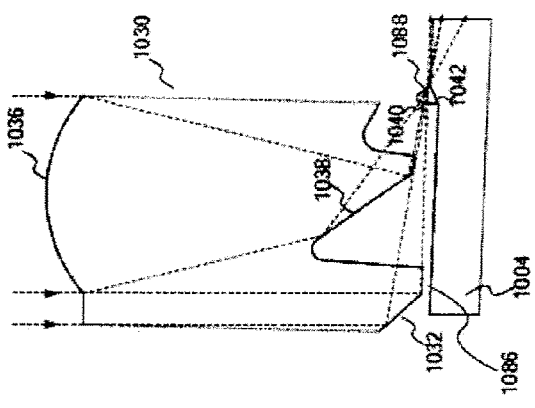

It is important for the light-guide layer and the deflecting layer to be in close contact with each other for purposes of alignment. This is because each functional unit, as shown in FIG. 4A-4D, consists of a set of deflecting elements aligned with a light insertion facet 1040 and aperture on the light-guide layer. In an actual part there may be a large number of functional units. Each deflecting element in the functional unit must focus light through the corresponding insertion facet and entrance aperture on the light-guide layer. If the separation distance or the lateral positioning between the light-guide layer and the deflecting layer falls outside of the tolerances of design then the light which is deflected and focused by the deflecting layer will not enter into the light-guide layer via the insertion facets. FIGS. 6A-6C show the same functional unit as shown in FIG. 4A-4D but with misalignments between the deflecting layer and the light-guide layer functional unit. FIG. 6A shows a vertical offset 1086 which leads to some of the light entering the light-guide layer to strike the facet 1088 which could potentially lead to its failure to couple into the light-guide. FIG. 6B shows a lateral offset 1090 that can lead to some rays striking the top of the light-guide layer 1042 at the point 1092. This can lead to a failure to couple light into the light-guide. FIG. 6C shows a lateral offset 1094 that can lead to some rays 1096 missing the insertion facet 1040 and the aperture 1042. In all cases, excessive offsets can lead to light not passing through the insertion aperture 1042 and not coupling into the light-guide, however there is clearly a tolerance to small displacements and imperfections that occur during fabrication. A gap between the deflecting layer and the light-guide 1033 is depicted in this embodiment.

In order to maintain all the elements on the light-guide layer and all the elements on the deflecting layer in proper alignment, one can take advantage of certain characteristic of the injection moulding process. FIGS. 7A-7D show an example of how. During injection moulding it is challenging to produce very flat parts however one can very easily make parts with a bow 1098, and one can chose the direction of that bow such as is shown in FIG. 7A. The deflecting layer 1000, the light-guide layer 1040 and the tray 1020 are all made with varying degrees of bow, with the tray being the flattest part and the deflecting layer being the most curved. The tray can be made extremely flat because it does not have to be transparent, whereas the deflecting layer and the light-guide layer need to be optically clear and therefore material and processing choices are more limited. The light-guide layer 1004 is brought into contact with the tray such that it touches at the points 1100. It is pulled down 1102 such that it conforms to the tray. The deflecting layer 1000 is brought into contact with the light-guide layer at the points 1104 and it is similarly pulled down 1106 so that it conforms to the light-guide layer. The seam 1022 where the three parts meet can be welded or fastened mechanically, and all three parts will maintain their alignment. Although not shown in FIGS. 7A-7C the secondary optic 1008 can be bonded to the light-guide layer 1004 prior to this assembly process so that the final assembly includes the secondary optic 1008 as well.

It is possible to achieve good parallelism between the deflecting layer and the light-guide layer in the absence of the tray by a similar means. As shown in FIGS. 8A & 8B the deflecting layer 1000 can be bowed in a similar manner as before. The parts can be brought into contact 1108 and pulled together 1110, with the seams 1112 bonded in any suitable manner. The combined parts will have good parallelism and maintain contact throughout, but might maintain a slight bow 1114.

A photovoltaic cell, mounted on a cell receiver assembly, is connected to an LG-CPV module. This connection is shown in FIGS. 9A & 9B. The tray 1020 can have a ledge 1116 for the PCB 1016 to sit on. A butyl based sealant 1118, or another sealant, can be applied in the space between the PCB and the tray to seal the unit. A silicone encapsulant 1020 is used to bond the PV cell 1006 to the secondary optic 1008. The same silicone can hold the mirrored insert component 1022 in position. Because the tray's bottom 1024 is lower than the bottom of the PCB 1026, in order to make it simpler to thermally bond the PCB to the heat-sink so that heat due to light absorbed at the PV cell can be dissipated, a block of thermally conductive material, such as a block of copper 1028, can be attached to the bottom of the PCB. This can be attached by way of reflow soldering, welding, brazing, epoxy or another means.

FIG. 10A-10D shows details on one PCB design including the following components: a dielectric substrate 1120, a substrate back contact 1122, a substrate front contact 1124, a triple junction cell 1126, a cell back metallization 1128, a cell front metallization 1130, a bypass diode 1018, a triple junction cell to substrate bond 1132, and a cell thermal block 1134.

In addition to vias in the ceramic substrate, interconnection between the front and back sides of the PCB can be made by way of jumpers, such as bands of copper, that loop around the edge of the PCB. This can create a problem for sealing the PCB and the Tray together, but this problem can be overcome. For example, if copper bands are used as jumpers, these bands can be insert-moulded into the tray. An example of a jumper 1134 is shown in FIG. 10E.

The glass secondary optic (or a secondary optic made of another material such as silicone, co-polymers, or another glass replacement material) can be bonded to the PV cell. This is in order to allow light to leave the secondary optic and be absorbed by the PV cell; if there is no optical bond then the rays may totally internally reflect or partially reflect at the interface between the secondary optic and the cell. However, if this optical bond extends beyond the active area of the cell it may cause rays to strike areas on the PCB or cell other than the active areas. These rays may be lost due to absorption by a material other than the PV cell or scattered in such a way as they do not later strike the PV cell. This creates a challenge for manufacturing as the bond must be maintained very well controlled in both volume and location, and it makes it difficult to employ the optical bonding agent simultaneously as an encapsulating material to protect the PV cell. This is because an encapsulating material should completely envelop the PV cell, and the optical bond should only cover the PV cell active area that is smaller than the whole PV cell and excludes the PV cell front side metallization and contacts.

In order to avoid this issue a low index film, such as the fluoropolymer Teflon™ made by the DuPont company, can be employed to make a mask which covers the cell and cell receiver assembly and which prevents light from striking areas other than the PV cell. This is possible because low index optical materials can have lower indices of refraction than the materials used to make the secondary optic and the optical bonding agent, and therefore light striking the interface between either the secondary optic and the low index film mask, or light striking the interface between the optical bonding agent and the low index film mask, can totally internally reflect.

The position and shape of this mask is shown in FIG. 11A-11D. A low index film mask 1136 can be cut so that it has a circular hole in the center to correspond with a circular active area 1138 on a PV cell 1006. The film can be brought into contact or adhered to the PCB 1016 so that it only exposes the active area of the PV cell. Alternatively, if a PV cell 1006 is being employed that uses a rectangular active area 1140 then the mask 1142 can be cut accordingly so that it exposes only the rectangular active area excluding the cell bus bars 1144. The action of this film is shown in FIGS. 12A & 12B. The film 1136 is placed between the secondary optic 1008 and the PV cell 1006. An encapsulant 1146 is allowed to envelop the cell and can be allowed to flow onto both sides of the film, connecting it to both the secondary optic 1008 and the PCB and cell. Light will totally internally reflect 1148 at any interface between the encapsulant and the film. In the hole at the center of the film, light is allowed to pass through and strike the cell active area.

Figure 13B:
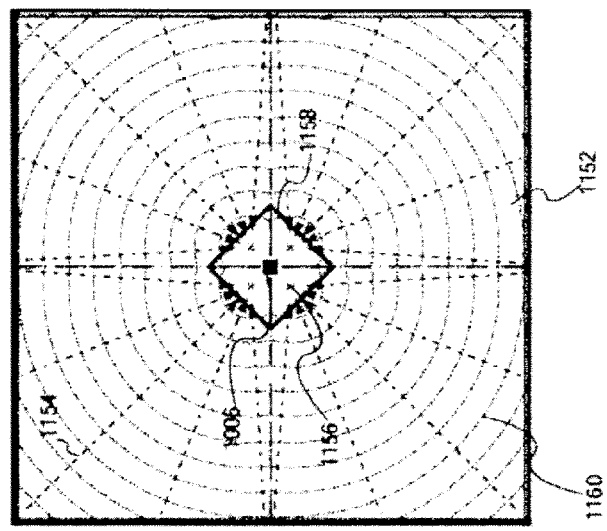
FIGS. 13A and 13B show four quadrant non-rotationally symmetric designs of embodiments of LG-CPV modules of the present invention.
Figure 13A:
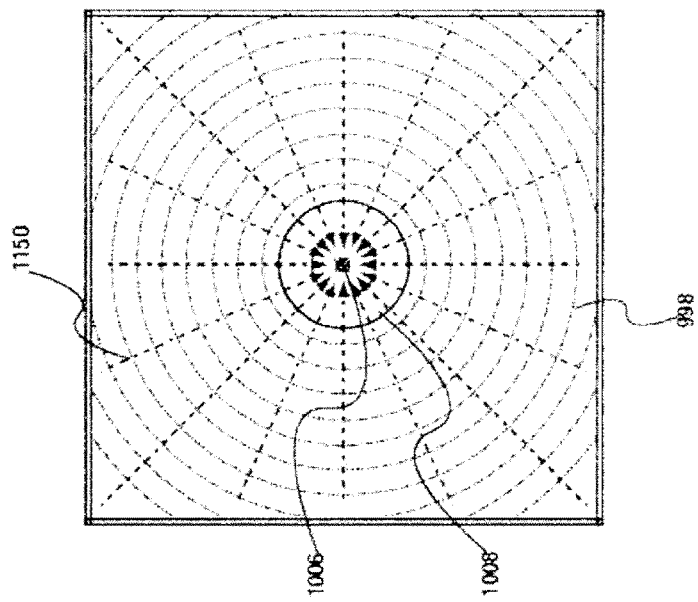

The deflecting layer and light-guide layer design, such as that shown in cross section in FIG. 1, is essentially a linear optic that has been revolved so that the light that it collects converges to the central axis of revolution. This produces a rotationally symmetric optic that causes all the light to converge to the central axis of rotation where the secondary optic couples said light onto a PV cell. However, the design could be swept in another manner such that the light does not converge to a central axis, but instead converges to other points or does not converge at all. Consider one example of a useful way of doing this shown in FIGS. 13A & 13B. FIG. 13A shows the design for an LG-CPV module 998 that causes all the light trapped in the light-guide layer 1150 to converge to the central PV cell 1006 where it needs to be redirected down onto the PV cell by a secondary optic 1008. An alternative light-guide solar panel 1152, shown in FIG. 13B could instead have four quadrants, shown as separated by the dashed lines. The trapped light 1154 in each quadrant could converge to the points 1156 marked by a dashed X. The secondary optic 1158 would also be non-rotationally symmetric and would take the light from each quadrant and combine this light onto a single, central PV cell 1006. The four quadrants could be made by sweeping the linear optical design along circles concentric about each of the focal points 1156 in each quadrant. The resultant arcs over which the features of the deflecting layer and light-guide layer would follow are shown with the dotted lines 1160. Such an LG-CPV module could be made in a nearly identical fashion as the panel already described, with the only changes being in the designs of the deflecting layer, the light-guide layer, the tray (so that it conforms to the light-guide layer) and the secondary optic. Everything else about materials, assembly processes, and fabrication considerations remains the same.

FIGS. 14A-14E show an example of a four-quadrant design. FIG. 14A shows a single quadrant with a deflecting layer 1162 and a light-guide layer 1164 (tray and other components not shown). One quarter of the secondary optic 1158 is also shown. The PV cell 1006 is shown at the center. FIG. 14B shows the four quadrants in a light-guide solar panel 1152. FIG. 14C shows how a cross section of one quadrant can look, with the deflecting layer 1162 inserting light into the light-guide layer 1164, and the secondary optic 1158. The light-guide layer has a plurality of reflectors 1163 and an output facet 1165. The light-guide is optically coupled to each of the optical focusing elements of the deflecting layer 1161. The plurality of reflectors 1163 of the light-guide layer are positioned and arranged such that the sunlight received is guided towards the output surface 1165 via multiple total internal reflections between a first reflective surface 1169 and the plurality of reflectors 1163. The secondary optic employing two reflecting surfaces 1166 and 1168 with focusing power in order to couple the light from the light-guide layer onto the cell PV 1006. FIG. 14D shows how the central portion 1170 of the deflecting layer can be arced to span over the secondary optic that is taller than the light-guide layer. FIG. 14E shows another example of a secondary optic 1172 where two reflections 1174 and 1176 with focusing power are employed to couple light from the light-guide onto the PV cell, however the second reflection 1176 sits on the opposite side of the center line 1178 of the whole panel.

Figures 15A, 15B, 15C:
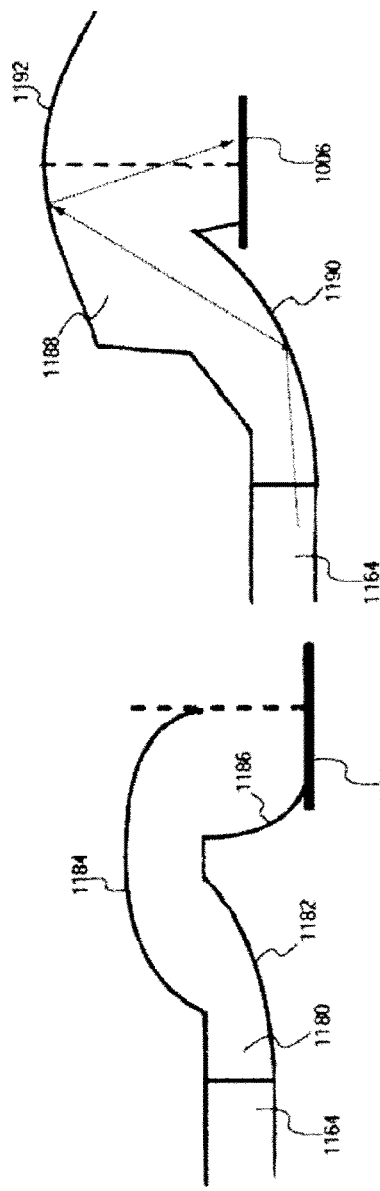
FIGS. 15A, 15B and 15C show details regarding secondary optic designs of various embodiments of the present invention.
Figure 15:
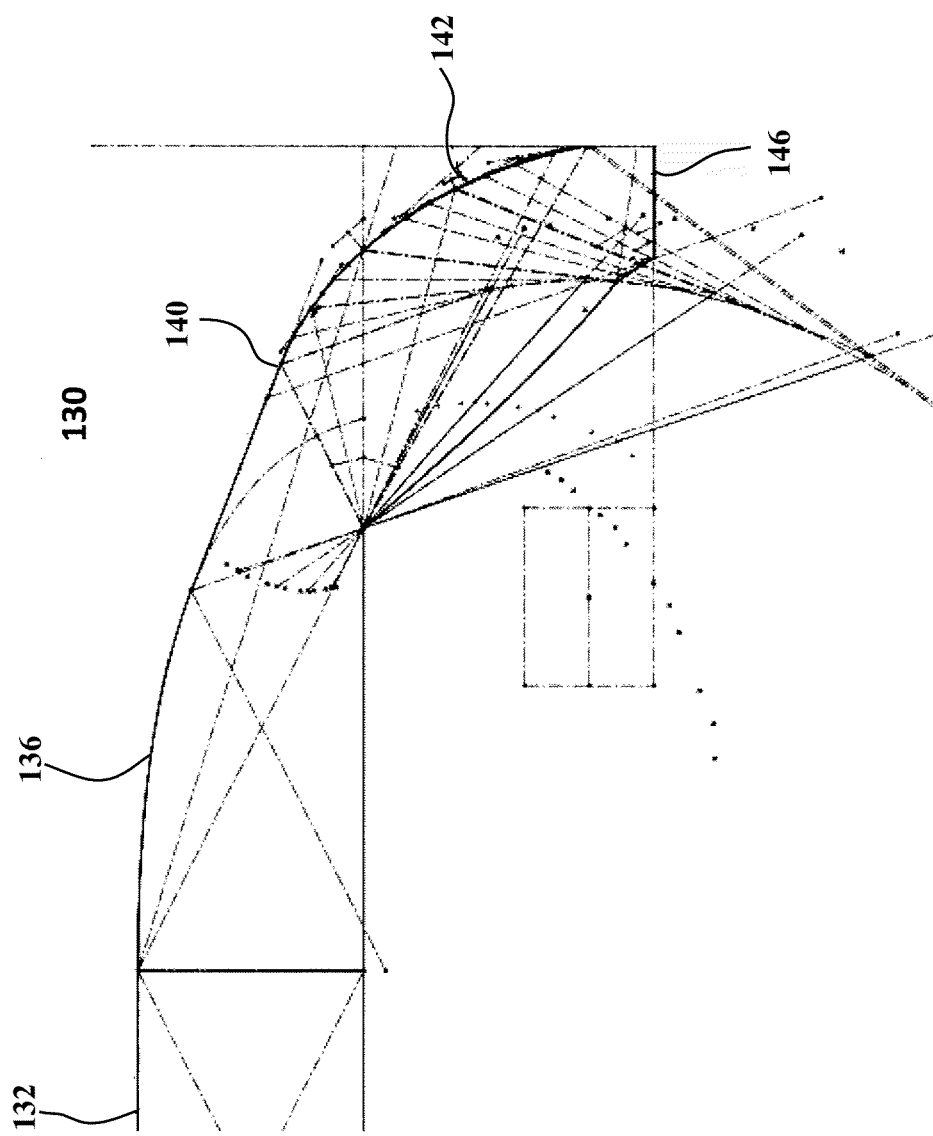
FIGS. 15D, 15E, 15F, 15G, 15H show other embodiments of the secondary optic of the present invention.
FIGS. 15I, 15J, 15K, 15L, 15M show other embodiments of the secondary optic of the present invention.
Figure 15:
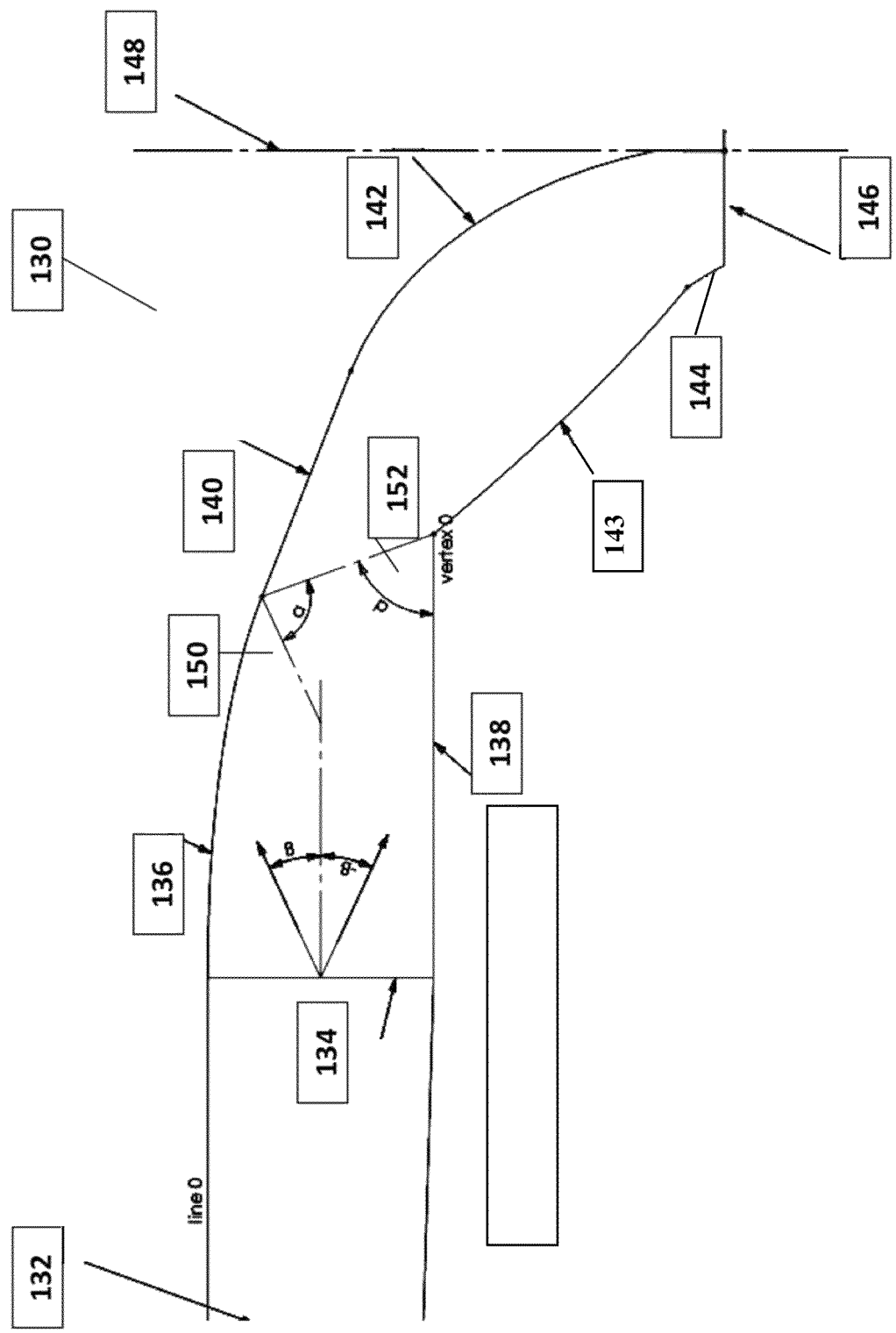

Other designs for secondary optics can also be considered, and a few are shown in FIGS. 15A-15C. FIG. 15A shows a secondary optic design 1180 where three reflecting surfaces with power 1182, 1184, and 1186 are employed to couple light from the light-guide layer 1164 to the PV cell 1006. FIG. 15B shows a secondary optic 1188 that can be made with quadrants where one reflecting surface 1190 is made in four segments and the second reflecting surface 1192 is one continuous surface shared by the four quadrants. FIG. 15C shows another secondary optic 1194 where it is comprised of materials with different indices, with the outside material 1196 having index $n_1$ and the material closest to the PV cell 1198 having index $n_2$. The interface 1200 made by these two materials can have focusing power and can help to couple light from the light-guide 1164 onto the PV cell 1006. This can be used in combination with a reflecting element 1202.

Although the secondary optics described in FIGS. 14A-14E & 15A-15C were described in reference to a four quadrant design, all could just as equivalently be used in a rotationally symmetric design as has been described in previous submissions of this patent family.

FIG. 15D shows another embodiment of the secondary optics 100 that is comprised of a series of compound conic and non-analytical shapes. The main advantage of this new system is that it requires no mirror coating on any of its surfaces. All light interacting with the system reflects within the material under TIR. The improved system increases overall optical efficiency. Absorption losses from the mirror are eliminated and light can now be collected directly above the concentrator. The first stage of the concentrator is a compound parabolic concentrator (CPC). The second stage interacts with the bottom half of the compound parabolic concentrator, redirecting the light downwards onto the photovoltaic cell. The third stage interacts mainly with light that has not interacted with the first two stages of the system. This third and final phase is a non-analytically defined curve which acts solely under TIR. The new system also increases the average incident ray angle. That is, there are less "glancing" or shallow rays interacting with the cell which improves system efficiency. Incident light from a light-guide layer 122 enters the first stage 102 of the secondary optic 100, through an entrance facet 101. Incident light is reflected and focused by a top reflecting surface 102 and a bottom reflecting surface 108 of the CPC, into the second stage 104 where light is reflected from a top reflecting surface 110 and a bottom reflecting surface 112. All light interacting with the system reflects within the material under total internal reflection. Light from the secondary optic is directed onto a photovoltaic cell located at the exit facet 114. The dotted line 103, is the axis of symmetry of the secondary optic 100.

Dead space directly above the concentrator is eliminated and light can be directly coupled onto the photovoltaic cell by means of a monolithic element 125. This monolithic is shown in FIGS. 15E and 15F. In the embodiment of FIG. 15E the secondary optic 100 and the light-guide 122 are fabricated as a single part, these can also be fabricated as two separate parts and optically bonded. FIG. 15F shows a magnified representation of the monolithic element 144.

FIGS. 15G and 15H show a design that operates at almost 100% efficiency for a defined set of incident rays under TIR and achieves a concentration ratio of 1.5 or more. The secondary optic 130 is designed for a specific extreme angle, using edge ray theorem. This embodiment comprises two partial compound parabolic concentrators (CPC). Incoming light enters the entrance face 134 at a given set of angles. Light can either interact with a parabola 136 in the first partial CPC, or a reflection face 138. The Partial CPC has its focus point at vertex 0 152, is tangent to line 0 at its beginning, and ends when the reflection of an incident extreme ray reaches the critical angle of reflection a of the material used for the secondary optic. The partial CPC thus has a central axis that is parallel to the extreme ray. A TIR face 140 extends linearly from the end of the parabola tangentially and interacts with the reflection face 138, redirecting the light downwards, onto a photovoltaic cell 146. A logarithmic or constant-angle spiral 142 is defined by the concentrator medium's critical angle; it is employed after the first stage whose vertex is vertex 0 and pitch is equal to the critical angle of reflection α. This logarithmic spiral interacts mainly with light that has not interacted with the first two stages of the system, concentrating to the maximum allowable amount limited by TIR. The secondary Partial CPC 143 begins at vertex 0 and continues to the inflecting heel 144. Its axis is parallel with angel d which is the output of the first partial 136 CPC and TIR face 140. Its focus is the mirror of the vertex between the exit aperture 146 and inflecting heel 144. The inflecting heal 144 redirects any light from the secondary partial CPC 142 that may escape the exit aperture 146. The line 148 is the axis of symmetry of the secondary optic. Because the secondary optic acts under total internal reflection, no mirror losses occur, and the area directly above the secondary optic may also couple light from directly above. The secondary optic can be made of a material such as Schott B270 with index of refraction 1.52. Other viable materials are copolymers and silicones. If the refractive index of the material increases to a value such as 1.6, then the critical angle increases and more rays are trapped inside the secondary optic, and the concentration factor increases by almost 20%. The acceptance angle is 1.03.

FIGS. 15I and 15J show another design for a secondary optic 150 comprising an entrance facet 151 positioned at an angle of 65 degrees 158, a curved top reflecting surface 153, a linear bottom reflecting surface 152 and a curved bottom reflecting surface 154 which allow the incoming sunlight to be focused under total internal reflection on an exit facet 156. This embodiment is not rotationally symmetric, as it is designed to converge from a circular shape into a square shaped exit facet 156 where light from the light-guide layer is focused on a square PV cell. All surfaces of this design are non-uniform rotational basis spline curves.

Figure 16:
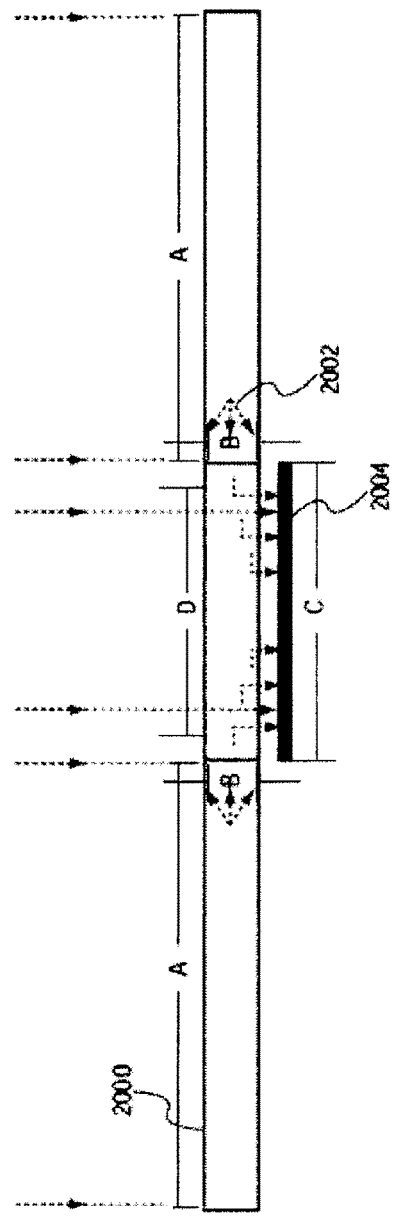
FIG. 16 shows a block diagram of a medium concentration design using a LG-CPV solar module of an embodiment of the present invention.

A different challenge is presented when one tries to do low concentration with a thin LG-CPV module onto a relatively large cell. Consider FIG. 16, showing a block diagram view of an LG-CPV module. The top of the panel 2000 has zones A that collect light and conduct that light in the light-guide 2002 by total internal reflection, concentrating it so that it passes through a zone B that has less area than zone A. Then the light is spread across a third zone C onto a PV cell 2004. Light incident on a fourth zone D on top of the PV cell will pass through the LG-CPV module without being subject to TIR and will strike the cell directly.

Figure 17:
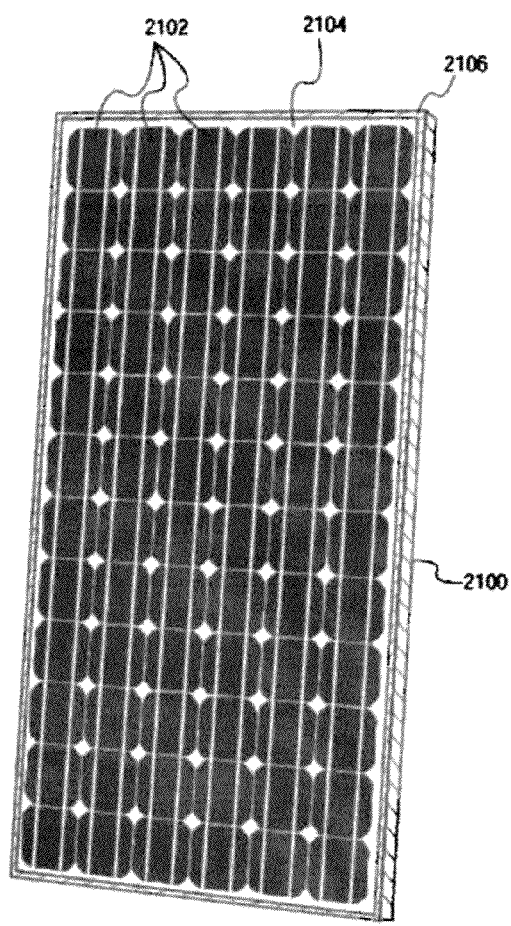
FIG. 17 shows a typical solar panel of the prior art.

Medium levels of concentration are very useful for silicon solar cells such as those used in typical conventional solar panels. A typical conventional solar panel 2100 is shown in FIG. 17. Typical conventional solar panels use silicon photovoltaic cells 2102 and a glass sheet cover sheet 2104, as well as an aluminum frame 2106. Typical conventional solar panels are expensive primarily because photovoltaic cells are expensive. Concentrated photovoltaics can be less expensive because they replace the expensive photovoltaic cells with less expensive optics.

Figure 18B:
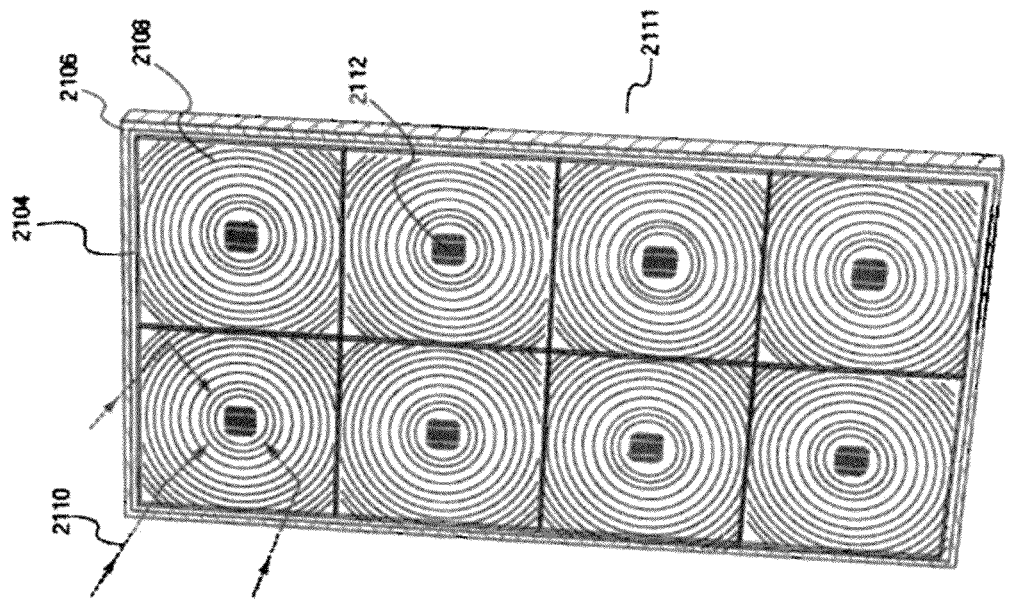
FIGS. 18A & 18B shows two embodiments of LG-CPV solar panel of the present invention for medium concentration.
Figure 18A:
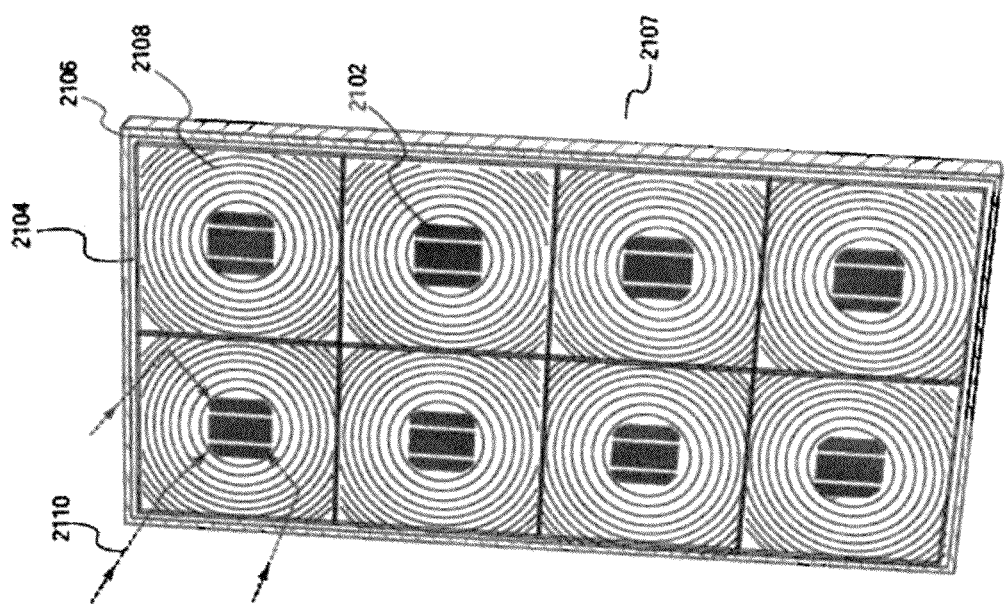

FIGS. 18A & 18B show a solar panel 2107 of the present invention, being made of an array of LG-CPV solar modules. In FIG. 18A most of the cells 2102 have been removed and replaced with LG-CPV solar modules 2108 that take incident sunlight 2110 and redirect it towards the cells (that remain). The cover glass sheet 2104 is still in place and the majority of the panel structure is identical. Because of the increase in sunlight at the cells, there may be a corresponding increase in heat and therefore there may be heat sinks or other cooling on the backs of the modules in order to enable the cells to remain cool.

FIG. 18B shows another solar panel 2111 having LG-CPV solar modules where the PV cells 2112 are smaller than in those of panel 2107. The panel in FIG. 18B has a higher concentration factor than the panel in FIG. 18A.

The LG-CPV solar modules of these solar panels work much like previously described LG-CPV solar modules. One is shown in cross section in FIGS. 19A & 19B. An injection moulded PMMA deflecting layer 2113 deflects and focuses incident light 2110 into an injection moulded PMMA light-guide layer 2114 which propagates the light through TIR to a cell 2102 at the center of the optics. In this embodiment, the light-guide layer 2114 is attached to a glass sheet 2104, the same sheet that protects the cells. Separating the glass sheet from the light-guide layer is a sheet of low index material 2116. This low index sheet can be, for example, a sheet of fluoropolymer such as those made by DuPont. The sheet can be bonded optically to the PMMA of the light-guide layer and to the glass sheet 2104 using ethylene vinyl acetate, polyvinyl acetate, silicone, or another lamination material. Because the low index sheet 2116 has a lower index than the PMMA light-guide 2114 total internal reflections can occur, such as a points 2118. In the area above the PV cell the low index sheet is perforated with holes 2120. These holes are filled with a material whose index is higher than the sheet, and close to that of the glass sheet and PMMA, so that some light traveling in the light-guide layer, such as the ray 2122, can pass through the low index sheet and strike the PV cell 2102. Other rays, such as ray 2123, will continue to propagate because they will reflect off the low index sheet rather than passing through the perforation holes. Other rays, such as ray 2124, will be at a shallow angle and will be deflected downwards by a curved facet 2126 at the end of the light-guide. This reflection 2127 can be by total internal reflection. Other rays, such as ray 2128, will be incident on the optic directly above the PV cell and will simply pass through the various windows of the deflecting layer and light-guide layer and low index film without being deflected and hit the PV cell. Other rays, such as ray 2130, hit the optic directly above the small hole 2132 in the center of the light-guide layer and will pass through the deflecting layer window and the glass sheet to hit the PV cell. Other rays, such as ray 2134, will hit the curved facet 2126 at the end of the light-guide layer at 2136, and they will be deflected but still hit the PV cell.

Figure 20A:
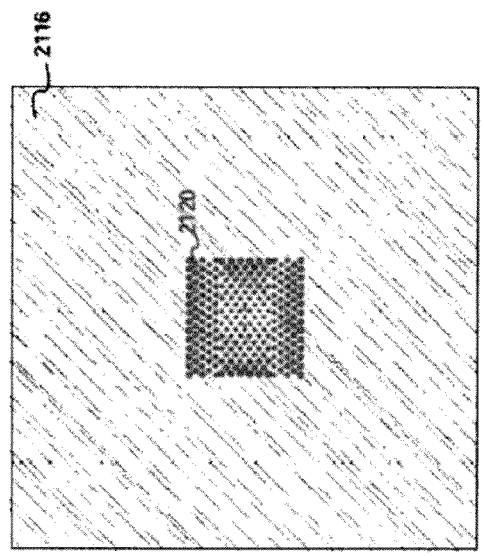
FIGS. 20A & 20B shows perforated low index films being embodiments of the present invention, FIG. 21A cross-sectional view of an LG-CPV module of an embodiment of the present invention.
Figure 20B:
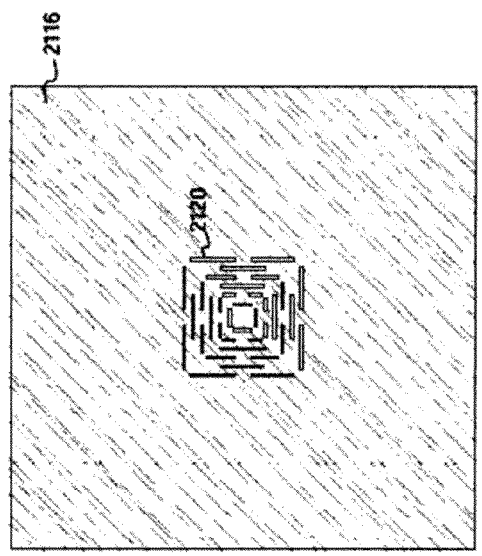

The uniformity of light on the PV cell is determined by the perforation pattern in the low index film. FIGS. 20A & 20B shows low index films 2116 with perforation holes 2120 in two configurations. As will be understood by a skilled worker, the optimal mask configuration can be worked out using a computer optimization routine. It is possible to make masks that provide for fully uniform light on the PV cell, which enhances performance. The perforated film is what allows the light-guide to be leaky; it allows some light to escape which allowing other light to continue inside the light-guide. In this way, the concentration on the cell can be controlled and large cells can be employed at medium concentration levels.

FIG. 21A shows a cut away three-dimensional view including a heat sink 2140. The heat sink sits under the PV cell 2102. The PV cell is encapsulated under a sheet of glass sheet 2104, with the low index film 2116 on top of that and the deflecting layer 2113 and light-guide layer 2114 on top of that. The deflecting layer is bonded to the light-guide layer at the flange 2142 of the optics.

The heat sink configuration shown in FIG. 21A could be used in conjunction with the panels shown in FIGS. 18A & 18B. Alternatively, the aluminum heat sink could be extruded and longer than a single and serve as a support for the module in the manner shown in FIG. 21B.

Figure 22:
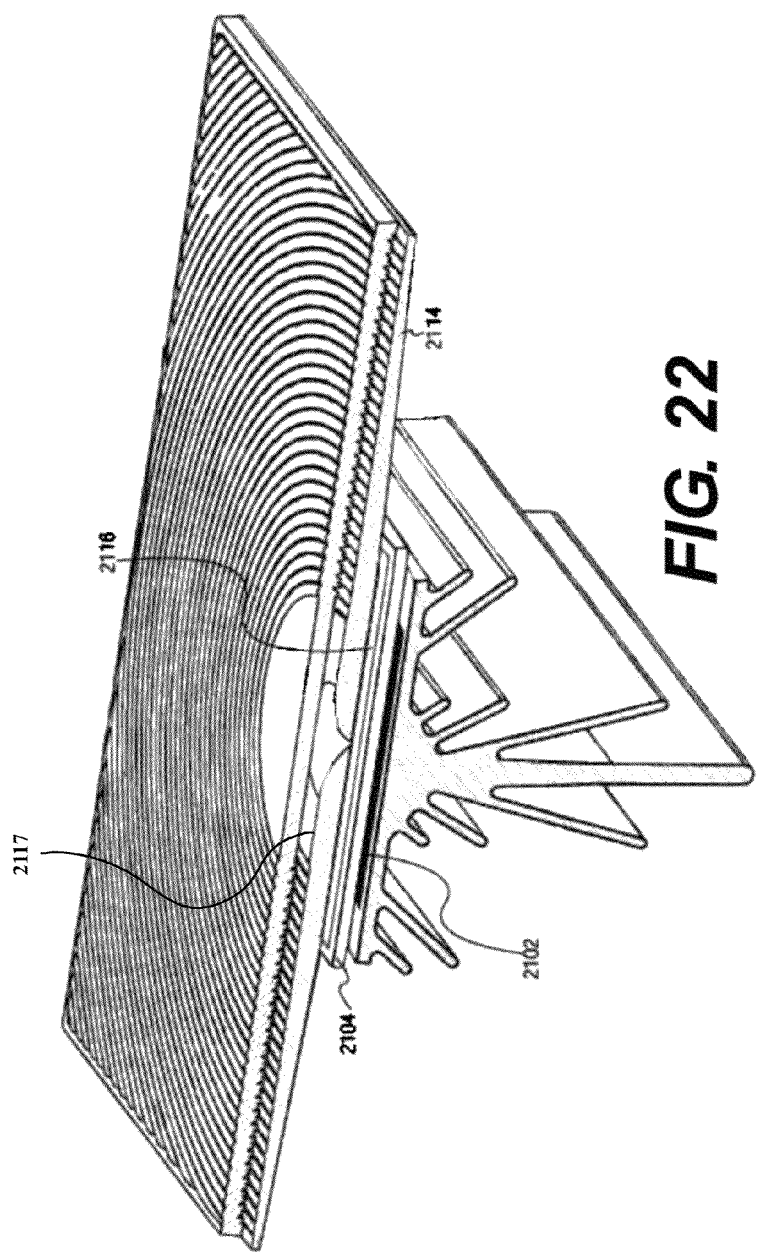
FIG. 22 shows a cross-section view of another embodiment of a LG-CPV module of the present invention with a heat sink.

The glass sheet does not need to extend the full width of the light-guide layer; it only needs to cover the cell. This is shown in FIG. 22. The glass sheet 2104 is smaller than the light-guide layer 2114 and only just covers the cell 2102. The perforated low index film 2116 is only needed in the area between the PV cell and the light-guide layer.

For greater clarity, the holes 2120 in the low index film 2116 must be filled with a material whose index is greater than the index of the low index film. This material inside the holes must be optically bonded to the light-guide layer and the glass sheet in order to provide an optical path from the light-guide to the glass sheet and make the light-guide leak.

In place of a low index film, air, which has an index of refraction of 1.0, could also be used. In this case, steps would need to be taken in order to ensure that the air gap between then light-guide layer and the glass substrate did not collapse. FIGS. 23A-23C show some examples of this. FIG. 23A shows how an optical path can be made between the light-guide layer 2114 and the glass 2104 if there are dimples 2146 on the bottom of the light-guide layer. These dimples make contact with and are optically bonded to the glass 2104, and they preserve an air gap 2148. This creates exactly the same leaky light-guide layer as a perforated low index film, with the dimples acting as the holes in the film and the air acting as the film itself. The dimples would be patterned on the bottom of the light-guide layer above the cell in the same pattern that the perforations in the low index film would be.

Alternately, as shown in FIGS. 23B & 23C a film 2150 whose index is close to the index of PMMA and the glass sheet could be perforated and placed in between the light-guide layer 2114 and the glass sheet 2104. The air 2148 in the holes would be left in place. The film would be optically bonded to the glass sheet and the light-guide layer, and act as an optical conduit from the light-guide layer to the glass sheet allowing for the leaky light-guide. Rays striking the bottom fact 2152 of the light-guide layer above where a hole is present would see a PMMA to air interface and would totally internally reflect.

Another way to do medium concentration is shown in FIG. 24. An air gap or low index gap 2154 is between the light-guide layer 2114 and the glass cover sheet 2104. This allows light in the light-guide layer to totally internally reflect 2156. A curved surface 2158 is used to reflect the light in the light-guide layer down towards the PV cell. The curved surface spreads the light towards the PV cell 2102. An optical coupling element 2160 is between the light-guide layer 2114 and the glass cover sheet 2104 so that light can pass from the light-guide layer through the glass cover sheet to the PV cell 2102.

Figure 25A:
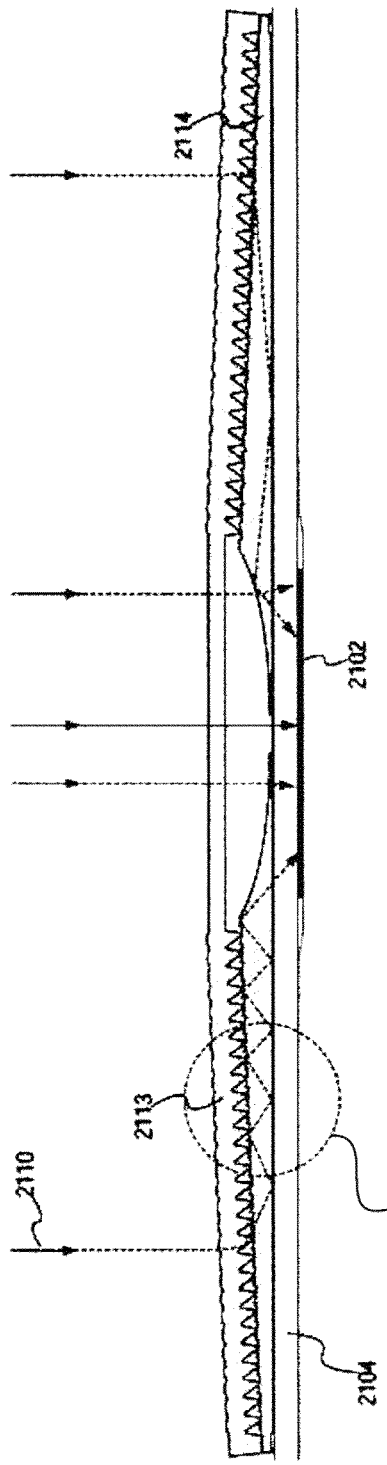
FIG. 25A shows an embodiment of a LG-CPV module of the present invention where the top facets and the bottom face of the light-guide layer converge.
Figure 25B:
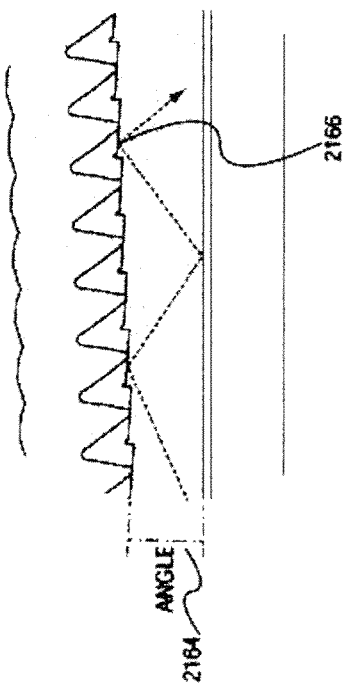
FIG. 25B shows a close-up view of the area in FIG. 25A indicted by the circle 25B.

FIGS. 25A & 25B show another variant on the design from FIG. 24. The top facets 2160 (shown at FIG. 24) of the light-guide layer 2114 and the bottom facets 2162 can have a slight convergence as shown by the angle 2164. As will be understood by the skilled worker, this slight convergence causes the light rays traveling in the light-guide layer to increase in angle of incidence 2166 slightly with each reflection. This can eventually lead to light escaping the light-guide layer. This was described in FIG. 6 to show that the light will eventually escape due to increased angle of incidence. However, provided that the increase in angle of incidence is done in a controlled manner it can be used to increase the angle of incidence of light without causing that light to escape, and this can encourage light to strike the PV cell towards its outside edge. This is a good thing to do for medium concentration levels as defined in FIG. 16.

FIG. 26 shows another embodiment of a medium concentration light-guide solar panel where the light-guide layer's bottom face 2170 is not in contact with the glass sheet 2104 but instead is sloped leaving a substantial air gap 2172 between the light-guide layer and the glass cover sheet. A sealant of some sort 2174 would be employed at the edges of the light-guide layer to prevent the light-guide layer from coming off the glass and in order to prevent dirt and other contaminants from entering the gap.

Figure 27A:
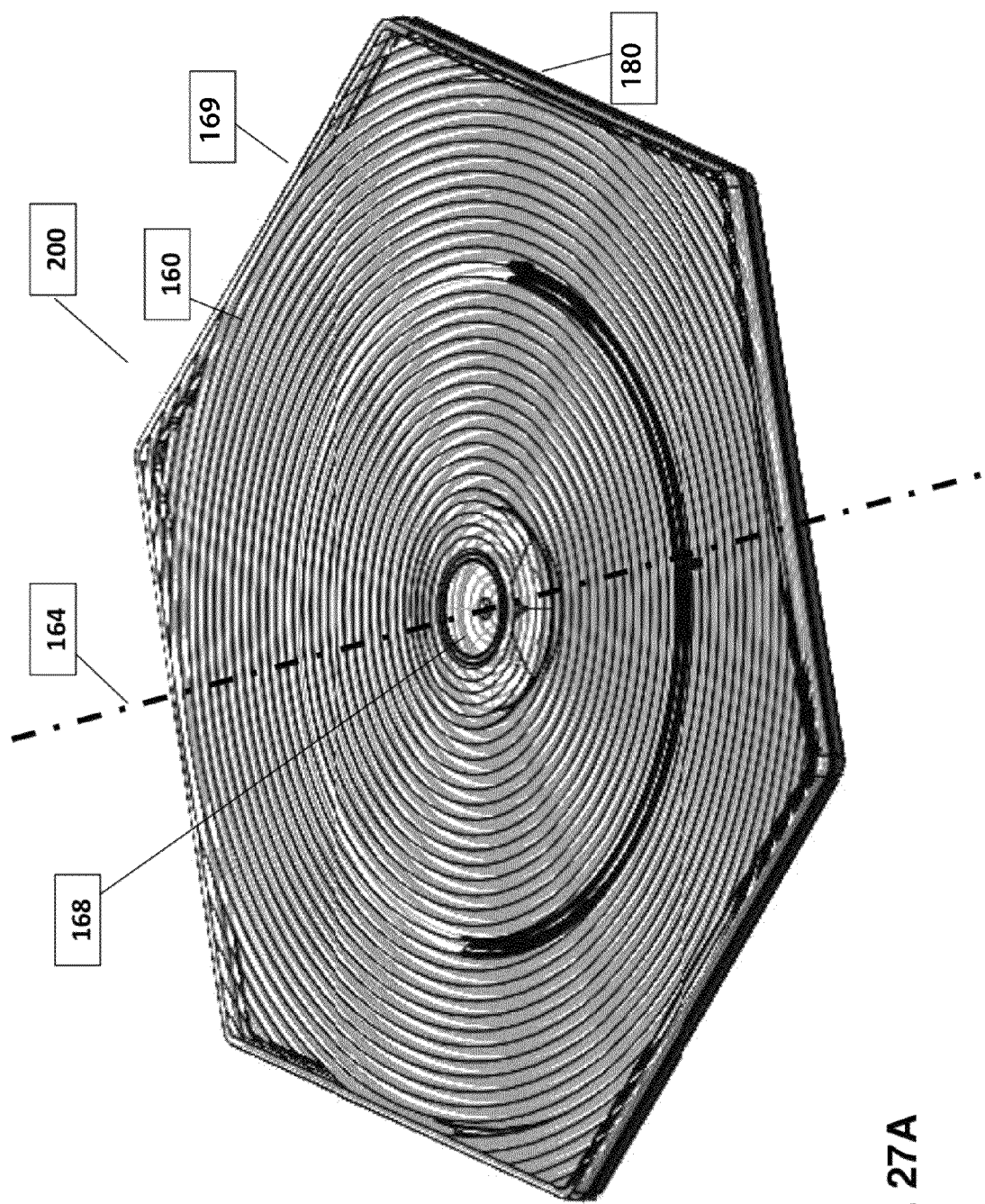
FIGS. 27A, 27B, 27C, 27D, 27E, 27F show other embodiments of the solar module, of the present invention.
Figure 27:
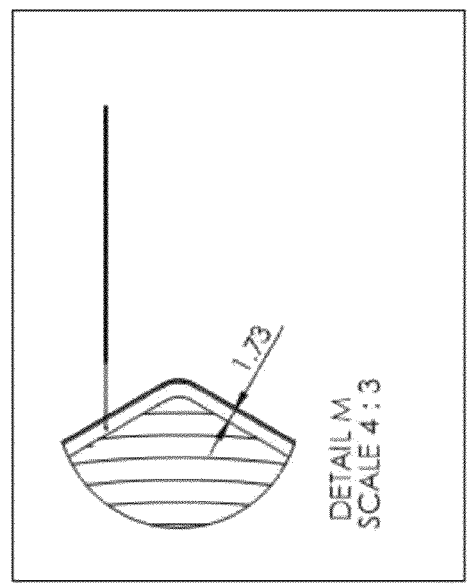
Figure 27:
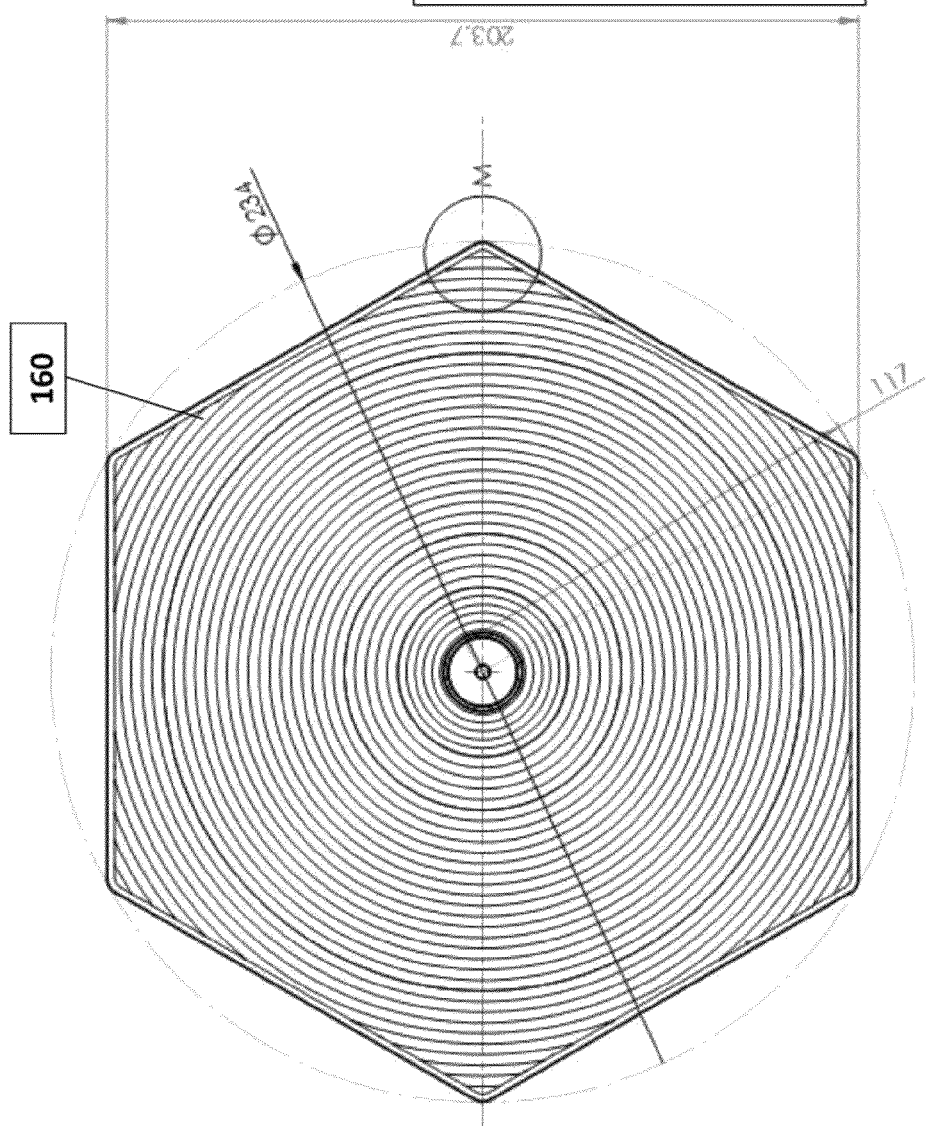
Figure 27E:
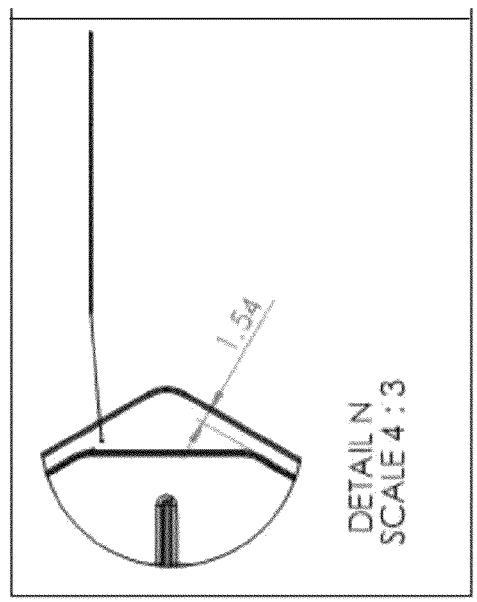
Figure 27:
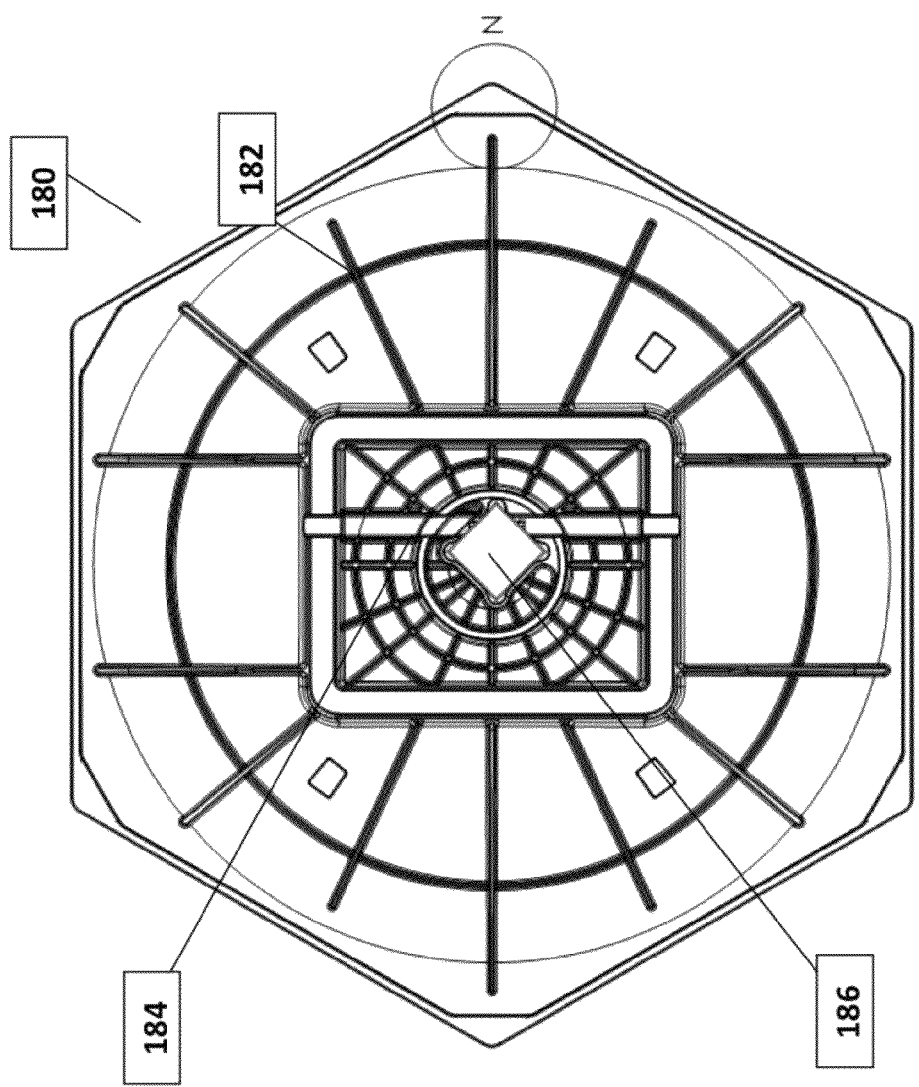
Figure 27F:
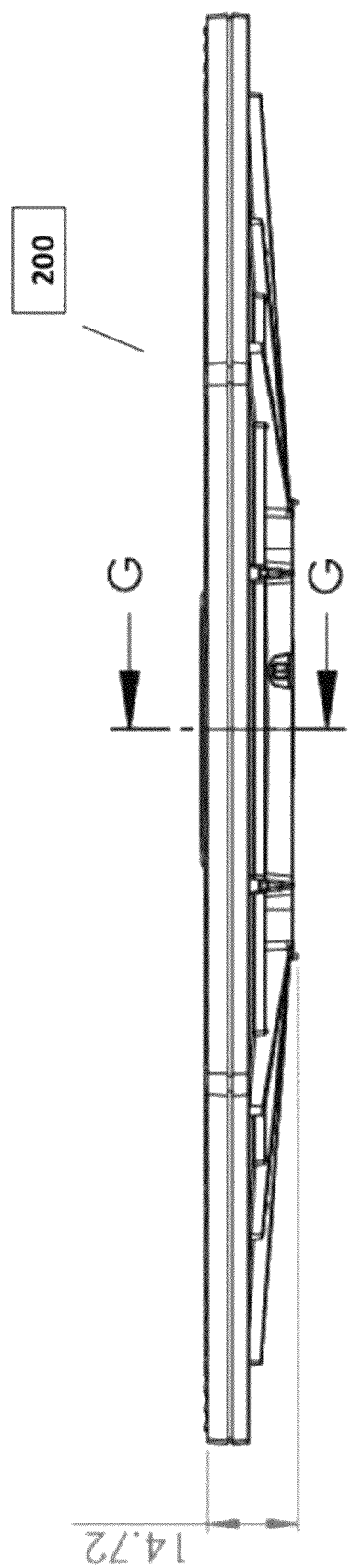

The embodiment of a hexagonal LG-CPV solar module 200 is shown in FIGS. 27A, 27B and 27C. This hexagonal design enables the solar modules to be tiled while expanding the surface area of each solar module, allowing for more annular focusing elements in the deflecting layer 160 and light-guide layer, which in time improve the optical efficiency of the solar module. A monolithic optic 168, located at the center of the deflecting layer 160, focuses incoming sunlight directly onto the secondary optic. A dotted line represents the axis of rotational symmetry 164 of the hexagonal LG-CPV solar module. A tray 180 holds the deflecting layer, light-guide layer, secondary optic and PV cell in place. Detail M shows the vertex of the solar module magnified to a scale 3:4, showing an ultrasonic welding flange of 1.73 mm width. The tray 180 is shown in further detail in FIG. 27D, comprising linear 182 ridges for structural support, an empty space 184 for wires to go through, a square cavity for containing a PV cell 186, and a bottom clamping surface, shown in detail N, the bottom clamping surface having a width of 1.54 mm. The tray can be made by moulding, and it can be made out of a polymer with the same coefficient of thermal expansion as the deflecting layer and the light-guide layer. In this way, the three largest components will have the same coefficient of thermal expansion, which will enable them to expand at the same rate and maintain alignment with each other while also not experiencing excessive stress. Furthermore, if the three components are made of the same material, or of materials that are compatible, they can be welded or bonded at their outer flange 169. The tray is designed in such a way that the solar module can be effectively attached to a heat sink. The thickness of the solar module 200 is 14.72 mm, this is shown in the embodiment of FIG. 27E. During the assembly of a hexagonal LG-CPV solar module 200, it is key that the deflecting layer 160 and the light-guide layer 170 are maintained in close contact at all points along their facing surfaces. This is because the functional units on the light-guide layer and on the deflecting layer must work together.

Figure 28:
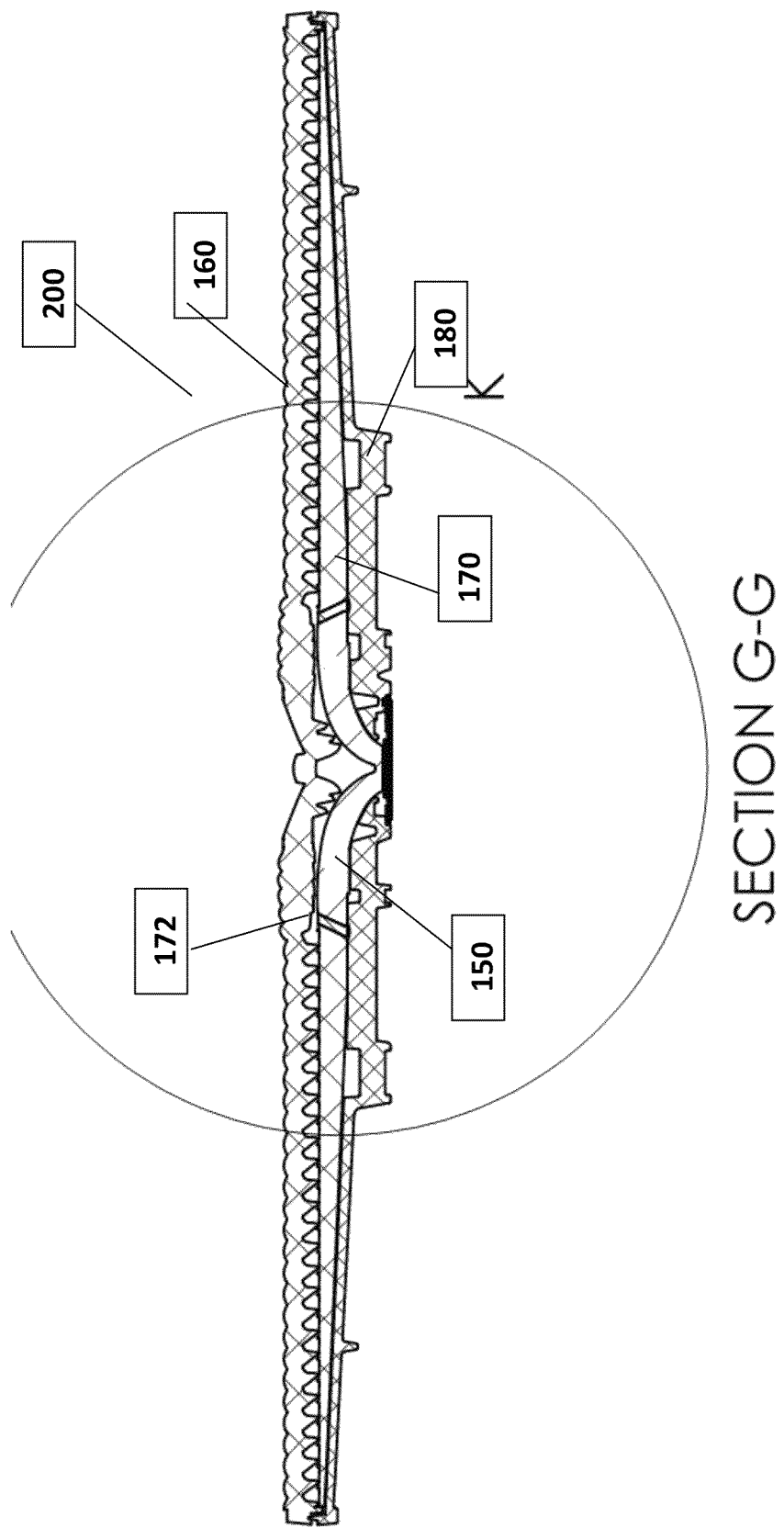
FIGS. 28A, 28B, 28C, 28D show other embodiments of the solar module in cross section, of the present invention.
Figure 28:
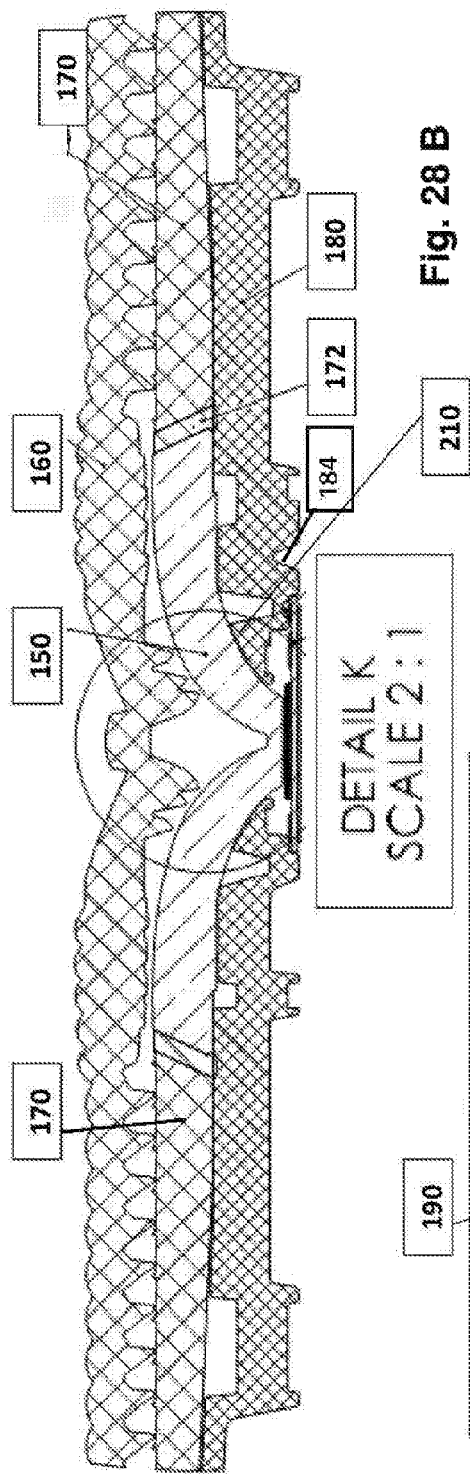
Figure 28:
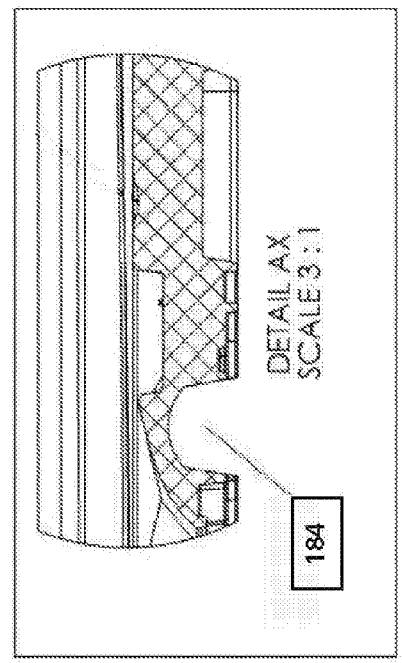
Figure 28:
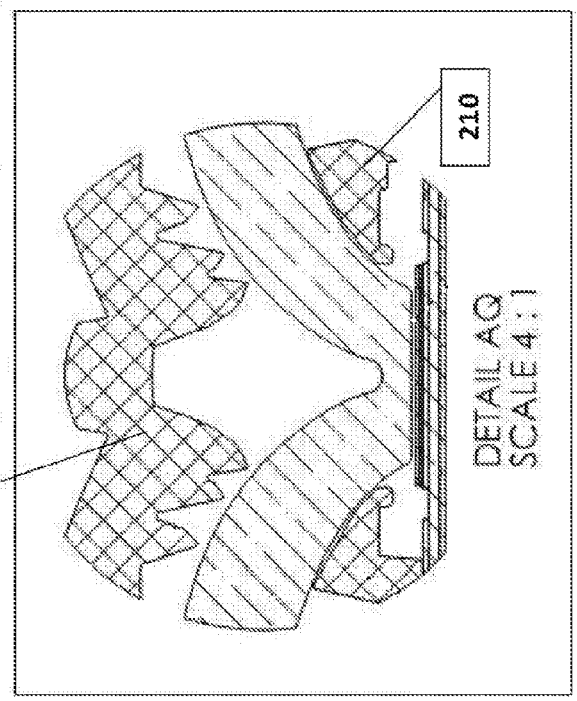

An exemplary embodiment of the hexagonal LG-CPV solar module 200 is shown in FIGS. 28A and 28B. This cross sectional view details the components of said solar module. In this embodiment the light-guide layer 170 and the secondary optic 150 are fabricated as two separate elements, and coupled by a bond made of optically transparent material. The thickness of the bond 172 is designed such that the material is in physical contact throughout operating temperature (e.g. −60 C to 90 C) through physical interference fit. This is achieved by considering the coefficient of thermal expansion between the secondary optic 150, the optical coupling element 172 and the light-guide 170. All light interacting with the secondary optic 150, reflects within the material under TIR. The secondary optic 150, light-guide 170 and optical coupling element 172 are tapered in such a way that increased pressure in the optical coupling element prompts a resultant force which pushes the secondary optic 150 downwards, towards a photovoltaic cell located at the exit facet 171 of the secondary optic 150, increasing optical efficiency. A monolithic element 190, which directs incoming light directly to the secondary optic 150, comprises optical elements and light reflecting steps which may be hyperbolic, parabolic, spherical, aspherical, linear, elliptical or any free-form. The dimensions of the monolithic element 190 will depend on a number of factors including the size and shape of the focusing elements, manufacturing tolerances, and whether the element is linear or circular. Preferred embodiments are those designed to provide higher concentration ratios for more efficient power generation and to reduce the amount of material used and manufacturing costs. Each reflection occurring within the monolithic element 190 is preferably but need not be with total internal reflection.

FIG. 28C shows details of the cross sectional area where the monolithic element 190, secondary optic 150 and PV cell 186 are coupled. The tray is moulded in such a way that supporting components 210 hold the secondary optic 150 in alignment with the PV cell 189. FIG. 28D shows detail of the cavity 184, where wire is meant to go through.

FIG. 29 shows an embodiment depicting the active optical sections of a solar module 212, including active optical input sections of the deflecting layer, the light-guide layer, the secondary optic, and the section where concentrated light exits the module. The embodiment of FIG. 30 shows that the length of a cross section of the solar module from vertex to vertex, is longer then the cross section from edge to edge.

Figure 31A:
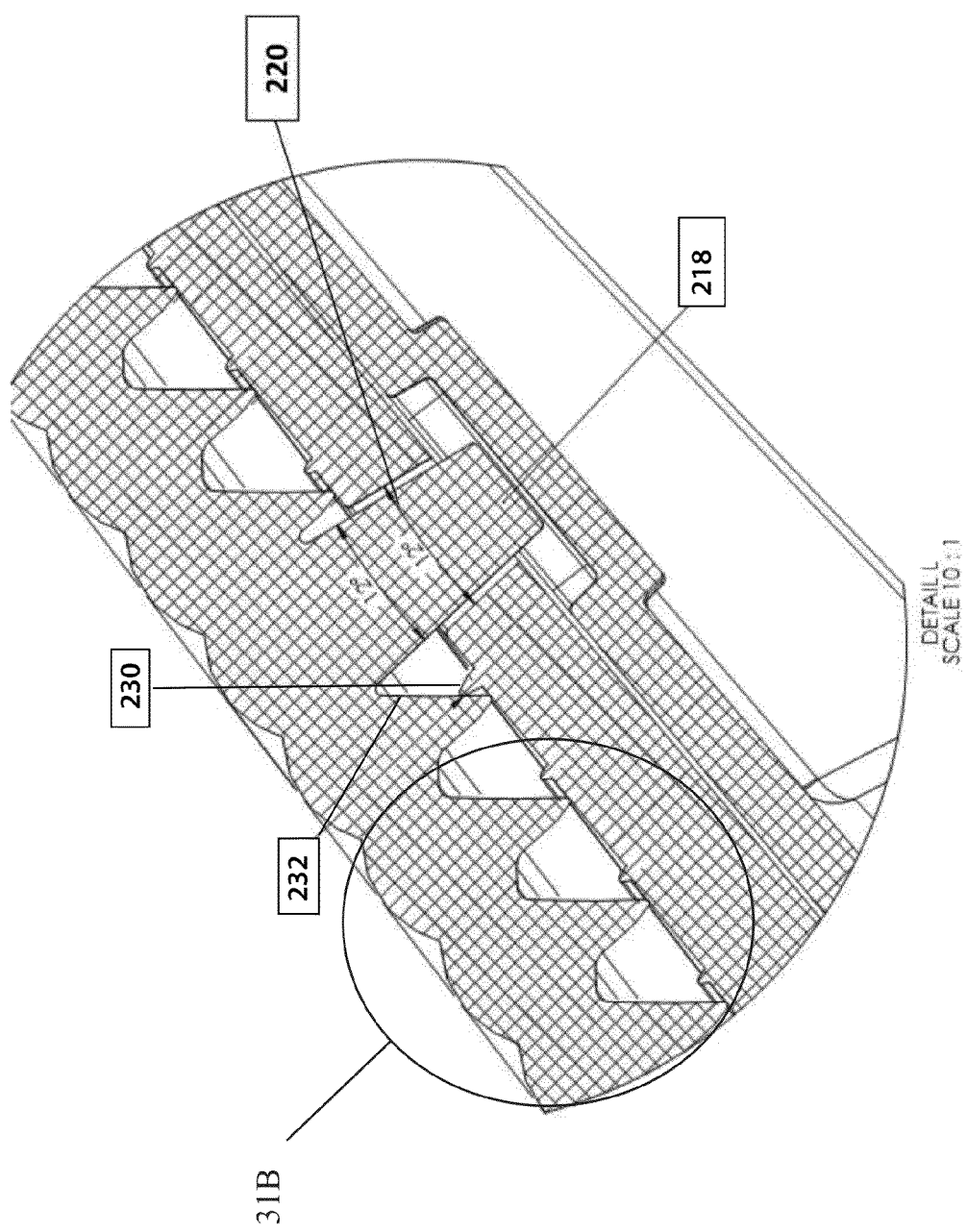
FIGS. 31A, 31B and 31C shows a detail of another embodiment of the solar module in cross section, of the present invention.
Figure 31C:
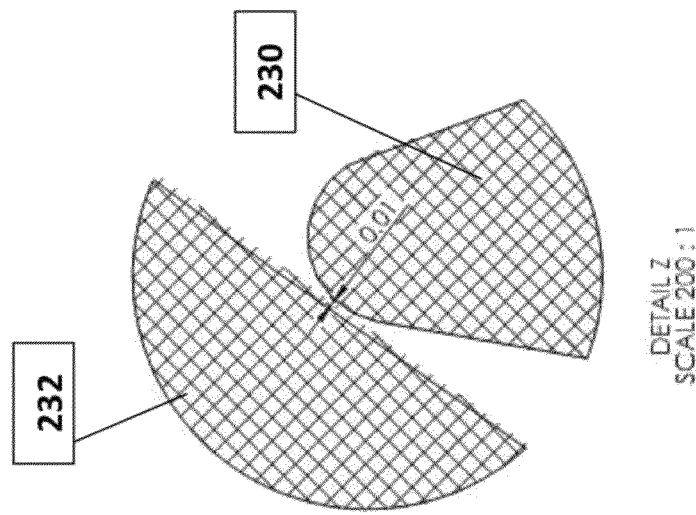
Figure 31B:
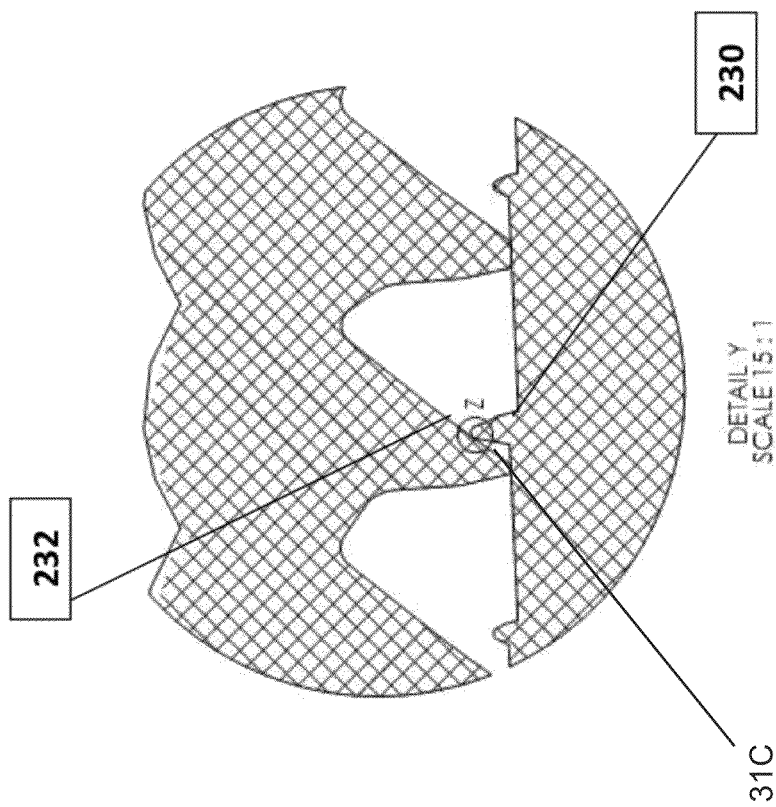

The embodiment shown in FIGS. 31A-31B show the heat stacking features of the solar module 200. A bass for clamping 220 in the deflecting layer is flattened against the light-guide through a heat stacking process. The bass 218 is fabricated at an angle of 12 degrees 220 to aid optical coupling between the deflecting layer and light-guide layer. Alignment rings in the deflecting layer 232 and in the light-guide layer 230 ensure the assembly of these components is optically efficient. Two magnifications of these features are shown to a scale of 15:1 and 200:1.

FIG. 32 shows another embodiment of the optical coupling element from FIGS. 28A and 28B, where instead of the light guide layer and secondary optic being coupled by an optically transparent bonding agent after moulded, a prism/silicone sleeve insert moulding 300 with a prism latch and an adhesive or silicone bond, couples the light-guide layer 306 and secondary optic 308. This feature stops the secondary optic 308 from shifting out of the top of the light-guide 306 when there is a small draft angle. It also allows the insertion of the secondary optic 308 and silicone/prism sleeve while the light-guide is hot. The secondary optic, prism/silicone sleeve and light-guide can be assembled immediately upon ejection from mould. This optical bond is designed to have minimal optical loses. In this embodiment, both the secondary optic 308 and the light-guide layer 306 have a latch (302 and 304). The embodiment of FIG. 33 shows an insert moulding with different geometry. In this embodiment the latch 304 in the light-guide layer 306 is bigger than the latch 302 in the secondary optic 308. A prism latch may be in the light guide only, the secondary optic only, or both. The latch in the light-guide layer captures the prism/silicone sleeve. If assembled when the light-guide is still hot from moulding, the light guide will shrink fit-around the prism/silicone sleeve while cooling in-mould or right after ejection. This feature has minimal optical impact, does not allow the secondary optic to escape through the top of the light-guide, does not have undercuts in the injection mould, and safely allows thermal expansion of the optical components present in this embodiment. The assembly of these components can be manual or automated without computer-vision guidance. This feature also secures the secondary optic in place during the lifetime of operation of the LG-CPV solar module.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Modifications and improvements to the above-described embodiments of the present invention may become apparent to those skilled in the art. The foregoing description is intended to be exemplary rather than limiting. The scope of the present invention is therefore intended to be limited solely by the scope of the appended claims.

The invention claimed is:

1. A photovoltaic light guide solar concentration apparatus having a central optical axis parallel in operation to incident sunlight, the photovoltaic light guide solar concentration apparatus comprising:
a deflecting layer exposable to the incident sunlight, the deflecting layer including a plurality of focusing elements, the plurality of focusing elements being rotationally symmetrically arranged with respect to the central optical axis;
a light-guide layer optically coupled to the plurality of focusing elements, the light-guide layer including a reflective surface and a plurality of facets rotationally symmetrically arranged with respect to the central axis and disposed opposite to the reflective surface, focused sunlight from the deflecting layer entering the light-guide layer being directed and trapped by the reflective surface and the facets opposite to the reflective surface and guided inside the light-guide layer towards an exit aperture through total internal reflections;
a secondary optic coaxially located with respect to the central optical axis and coupled to the light-guide layer, the secondary optic having at least one reflective surface, the secondary optic for redirecting the light towards the exit aperture;
a photovoltaic cell located at the exit aperture and on the central axis for receiving sunlight from the secondary optic.

2. A photovoltaic light guide solar concentration apparatus according to claim 1 wherein the reflective surface of the secondary optic is a totally reflective surface.

3. A photovoltaic light guide solar concentration apparatus according to claim 1 wherein the reflective surface of the secondary optic is a parabola.

4. A photovoltaic light guide solar concentration apparatus according to claim 1 wherein the reflective surface of the secondary optic is part of a compound parabolic concentrator.

5. A photovoltaic light guide solar concentration apparatus according to claim 1 wherein the reflective surface of the secondary optic is a freeform surface.

6. A photovoltaic light guide solar concentration apparatus according to claim 1 wherein the secondary optic is a solid component made of a sun light optically transmissive material and includes an entrance facet.

7. A photovoltaic light guide solar concentration apparatus according to claim 6 wherein the secondary optic includes a non-circular exit facet.

8. A photovoltaic light guide solar concentration apparatus according to claim 6 wherein an optical coupling element is positioned between the light guide layer and the secondary optic.

9. A photovoltaic light guide solar concentration apparatus according to claim 8 wherein the optical coupling element includes a latch that positions the optical coupling element relative to one of the secondary optic and the light guide layer.

10. A photovoltaic light guide solar concentration apparatus according to claim 1 further comprising a tray that secures one of the deflecting layer and the light-guide layer.

11. A photovoltaic light guide solar concentration apparatus according to claim 10 wherein the tray retains the photovoltaic cell.

12. A photovoltaic light guide solar concentration apparatus according to claim 10 wherein the tray includes supporting components to hold the secondary optic in place.

13. A photovoltaic light guide solar concentration apparatus according to claim 1 wherein one of the deflecting layer and light guide layer includes an alignment feature.

14. A photovoltaic light guide solar concentration apparatus according to claim 1 wherein one of the deflecting layer and light guide layer includes a clamping feature to secure the two layers.

15. A photovoltaic light guide solar concentration apparatus having a central optical axis parallel in operation to incident sunlight, the photovoltaic light guide solar concentration apparatus comprising:
a deflecting layer exposable to the incident sunlight, the deflecting layer including a plurality of focusing elements, the plurality of focusing elements being rotationally symmetrically arranged with respect to the central optical axis;
a light-guide layer optically coupled to the plurality of focusing elements, the light-guide layer including a reflective surface and a plurality of facets rotationally symmetrically arranged with respect to the central axis and disposed opposite to the reflective surface, focused sunlight from the deflecting layer entering the light-guide layer being directed and trapped by the reflective surface and the facets opposite to the reflective surface and guided inside the light-guide layer towards an exit aperture through total internal reflections;

a secondary optic coaxially located with respect to the central optical axis and coupled to the light guide layer, the secondary optic having at least one reflective surface, the secondary optic for redirecting the light towards the exit aperture;

a photovoltaic cell located at the exit aperture and on the central axis for receiving sunlight from the secondary optic within an acceptance angle relative to the central axis via an interface.

16. A photovoltaic light guide solar concentration apparatus having a central optical axis parallel in operation to incident sunlight, the photovoltaic light guide solar concentration apparatus comprising:

a deflecting layer exposable to the incident sunlight, the deflecting layer including a plurality of focusing elements, the plurality of focusing elements being rotationally symmetrically arranged with respect to the central optical axis;

a light-guide layer optically coupled to the plurality of focusing elements, the light-guide layer including a reflective surface and a plurality of facets rotationally symmetrically arranged with respect to the central axis and disposed opposite to the reflective surface, focused sunlight from the deflection layer entering the light-guide layer being directed and trapped by the reflective surface and the facets opposite to the reflective surface and guided inside the light-guide layer towards an exit aperture through total internal reflections;

a secondary optic coaxially located with respect to the central optical axis and coupled to the light guide layer, the secondary optic having at least one reflective surface the secondary optic to redirect the light towards the exit aperture;

a photovoltaic cell located at the exit aperture and on the central axis to receive sunlight from the secondary optic within an acceptance angle relative to the central axis via an interface;

a tray that secures one of the deflecting layer and the light-guide layer.

17. A photovoltaic light guide solar concentration apparatus according to claim 1 further comprising a heat sink thermally coupled to the photovoltaic cell to receive heat generated by the concentrated light projected via the secondary optic onto the photovoltaic cell.

18. A photovoltaic light guide solar concentration apparatus according to claim 15 further comprising a heat sink thermally coupled to the photovoltaic cell to receive heat generated by the concentrated light projected via the secondary optic onto the photovoltaic cell.

19. A photovoltaic light guide solar concentration apparatus according to claim 16 further comprising a heat sink thermally coupled to the photovoltaic cell to receive heat generated by the concentrated light projected via the secondary optic onto the photovoltaic cell.

* * * * *